(12) United States Patent
Hayashi et al.

(10) Patent No.: US 10,037,391 B2
(45) Date of Patent: Jul. 31, 2018

(54) SEMICONDUCTOR DEVICE

(71) Applicant: Hitachi, Ltd., Chiyoda-ku, Tokyo (JP)

(72) Inventors: Masato Hayashi, Tokyo (JP); Chihiro Yoshimura, Tokyo (JP); Masanao Yamaoka, Tokyo (JP)

(73) Assignee: HITACHI, LTD., Tokyo (JP)

( * ) Notice: Subject to any disclaimer, the term of this patent is extended or adjusted under 35 U.S.C. 154(b) by 618 days.

(21) Appl. No.: 14/645,928

(22) Filed: Mar. 12, 2015

(65) Prior Publication Data

US 2016/0063148 A1 Mar. 3, 2016

(30) Foreign Application Priority Data

Aug. 29, 2014 (JP) ................................ 2014-176560

(51) Int. Cl.
| | |
|---|---|
| *G06F 7/60* | (2006.01) |
| *G06F 17/10* | (2006.01) |
| *G06F 17/50* | (2006.01) |
| *G06N 7/00* | (2006.01) |
| *G06N 99/00* | (2010.01) |
| *G11C 11/16* | (2006.01) |

(52) U.S. Cl.
CPC ......... *G06F 17/5009* (2013.01); *G06N 7/005* (2013.01); *G06N 99/002* (2013.01); *G11C 11/1659* (2013.01)

(58) Field of Classification Search
None
See application file for complete search history.

(56) References Cited

U.S. PATENT DOCUMENTS

| | | |
|---|---|---|
| 5,131,072 A | 7/1992 | Yoshizawa et al. |
| 2014/0046626 A1 | 2/2014 | Yamamoto et al. |

FOREIGN PATENT DOCUMENTS

| | | |
|---|---|---|
| EP | 0 557 997 A2 | 9/1993 |
| JP | H 05-242065 A | 9/1993 |
| JP | 08-006915 A | 1/1996 |
| JP | 2011-242931 A | 12/2011 |
| JP | 2012-217518 A | 11/2012 |
| WO | WO 90/02381 | 3/1990 |
| WO | WO 2012/118064 A1 | 9/2012 |

OTHER PUBLICATIONS

Cowen, C.P. et al., "A Reconfigurable Monte-Carlo Clustering Processor (MCCP)", 1994, IEEE.*

(Continued)

*Primary Examiner* — Cedric Johnson
(74) *Attorney, Agent, or Firm* — Foley & Lardner LLP

(57) ABSTRACT

A semiconductor device is provided with a plurality of semiconductor chips, each of which simulates interactions between nodes of an interaction model, and an inter-chip wire, wherein the plurality of semiconductor chips are used to simulate interactions between nodes of a single interaction model; each semiconductor chip includes a connection unit that sends and receives some of the values indicating the state of the nodes, which are retained by a necessary element unit, via inter-chip wire to and from another semiconductor chip or sends and receives the values indicating state of the nodes, which are retained by the necessary element unit to and from the other semiconductor chip while sharing the inter-chip wire by means of time sharing.

13 Claims, 27 Drawing Sheets

(56) References Cited

OTHER PUBLICATIONS

Lin, Y. et al., "Monte Carlo Simulation of the Ising Model on FPGA", 2012, Journal of Computational Physics 237, Elsevier Inc.*
Gilman, A. et al., "3D Lattice Monte Carlo Simulations on FPGAs", 2013, Proceedings of the International Conference on Computer Design (CDES), Athens: The Steering Committee of the World Congress in Computer Science, Computer Engineering and Applied Computing (WorldComp).*

* cited by examiner

SEMICONDUCTOR DEVICE

CROSS-REFERENCE TO RELATED APPLICATIONS

This application relates to and claims priority from Japanese Patent Application No 2014-178580 filed on Aug. 29, 2014, the entire disclosure of which is incorporated herein by reference.

BACKGROUND

Field of the Invention

The present invention relates to a semiconductor device. Particularly, the invention is suited for use in a semiconductor device that simulates interactions between spins of a large-scale Ising model.

Description of Related Art

Various physical phenomena and social phenomena can be expressed with interaction models. An interaction model is a model defined by a plurality of nodes constituting the model and interactions between the nodes, and bias for each node if necessary. Various models are suggested in physics and social science, but any of them can be interpreted as one form of interaction models. Furthermore, as an example of characteristics of the interaction model, influences between the nodes are limited to interactions between two nodes (interactions between two bodies). For example, considering dynamics of planets in outer space, it can be interpreted as one type of interaction model as there are interactions by universal gravitation between the nodes which are the planets; however, influences between the planets are not limited to those between two planets and three or more planets influence each other and exhibits complicated behaviors (thereby causing problems such as so-called "three-body problems" or "N-body problems").

In the world of biology, a neural network which models a brain can be listed as an example of the interaction model. The neural network has artificial neurons, which simulate nerve cells, as nodes and there are interactions called synaptic connections between the artificial neurons. Also, a bias may be given to each neuron. Regarding the world of social science, for example, if you think about human communications, you could easily understand that there are nodes called humans and interactions composed of languages and communications. Also, it is easily imaginable that each human has its individual bias. Accordingly, there is a study to try clarifying properties, of the human communications by simulating them as an interaction model (for example, Japanese Patent Application Laid-Open (Kokai) Publication No. 2012-217518).

On the other hand, an Ising model can be an example of a representative interaction model in the world of physics. The Ising model is a model of statistical dynamics to explain behaviors of a magnetic substance. The Ising model is defined by spins having two values, that is, +1/−1 (or 0/1 or up/down), an interaction coefficient indicative of an interaction between the spins, and an external magnetic field coefficient for each spin.

Energy of the Ising model at the relevant time can be calculated from a spin alignment, the interaction coefficient, and the external magnetic field coefficient which are defined. An energy function of the Ising model can be generally represented by the following expression.

[Math. 1]

$$E(s) = -\sum_{i<j} J_{i,j}\sigma_i\sigma_j - \sum_i h_i\sigma_i \quad (1)$$

Incidentally, $\sigma_i$ and $\sigma_j$ represent i-th and j-th spin values, respectively; $J_{i,j}$ represents the interaction coefficient between the i-th and j-th spins; $h_i$ represents the external magnetic field coefficient for the i-th spin; and $\sigma$ represents the spin alignment.

A first term of expression (1) is to calculate energy attributable to the interaction between the spins. Generally, the Ising model is expressed as an undirected graph and does not distinguish between an interaction from the i-th spin to the j-th spin or an interaction from the j-th spin to the i-th spin. Therefore, the first term calculates the influence of the interaction coefficient with respect to a combination of $\sigma_i$ and $\sigma_j$ that satisfy i<j. Also, a second term is to calculate energy attributable to the external magnetic field for each spin.

A ground-state search of the Ising model is an optimization problem to find a spin alignment that minimizes the energy function of the Ising model. It is known that when the range of the interaction coefficient and the external magnetic field coefficient is not limited, finding the ground state of the Ising model whose topology becomes a nonplanar graph is an NP-hard problem.

The ground-state search of the Ising model is used not only to explain behaviors of a magnetic substance which is originally a target of the Ising model, but also for various uses. This can be because the Ising model is the simplest model based on interactions and also has the capability to express various phenomena attributable to interactions. For example, Japanese Patent Application Laid-Open (Kokai) Publication No. 2012-217518 discloses a method for estimating the degree of stress in a group such as a workplace organization by using the ground-state search of the Ising model.

Furthermore, the ground-state search of the Ising model also deals with a maximum cut problem known as an NP-hard graph problem. Such a graph problem is widely applicable to, for example, community detection in social networks and segmentation for image processing. Therefore, any solver that performs the ground-state search of the Ising model can be applied to such various problems.

Since finding the ground state of the Ising model is an NP-hard problem as described above, solving the problem with von Neumann computers is difficult in terms of calculation time. While an algorithm that introduces heuristics to increase the speed is suggested, there is suggested a method of finding the ground state of the Ising model at high speeds, without using the von Neumann computers, by calculation that utilizes physical phenomena more directly, that is, by using analogue computers (for example, WO2012/118064).

Such a device requires alignment corresponding to a problem to be solved. In a case of the Ising model, elements that represent each one of spins and an interaction between the relevant spin and another spin (hereinafter referred to as the "element units") are required corresponding to the number of spins in the Ising model for which the ground state should be searched. For example, with the device disclosed in WO 2012/118064, spins are associated with lasers and, therefore, lasers whose quantity is proportionate to the number of spins are required. In other words, high scalability that enables mounting of numerous element units is required.

In consideration of the above-described circumstances, the ground-state search of the Ising model should preferably be performed with a solid-state component such as a semiconductor device that can be implemented by regularly arranging numerous element units. Particularly, it is desirable that such a solid-state component has an array structure represented by a storage apparatus such as a DRAM (Dynamic Random Access Memory) or an SRAM (Static Random Access Memory) and the element unit has a simple structure to enhance accumulation ability. Therefore, in recent years, the applicant of the present application has been developing such semiconductor devices (semiconductor chips).

Meanwhile, in order to construct such a semiconductor device, for example, a semiconductor device that simulates interactions between spins of a large-scale Ising model, it is necessary to mount as many element units as the number corresponding to the number of spins on the semiconductor chip. Such a semiconductor device has a large chip size and its manufacturing cost is high. Therefore, in order to implement such a semiconductor device, it is desirable to construct the semiconductor device by connecting a plurality of semiconductor chips which are equipped with a certain number of element units.

However, if such a method is employed, a wiring amount between the semiconductor chips increases, thereby causing problems of an increase of the manufacturing cost and the occurrence of difficulty in implementation.

The present invention was devised in consideration of the above-described circumstances and aims at suggesting a semiconductor device that can simulate interactions between nodes of a large-scale interaction model and can be easily manufactured at inexpensive cost.

SUMMARY

In order to solve the above-described problem, provided according to an aspect of the present invention is a semiconductor device including: a plurality of semiconductor chips, each of which simulates interactions between nodes of an interaction model and; an inter-chip wire connecting the semiconductor chips, wherein the plurality of semiconductor chips are used to simulate interactions between nodes of a single interaction model; wherein each of the semiconductor chips includes: a plurality of element units, each of which retains values indicating a state of corresponding nodes and interaction coefficients between other nodes causing an interactions over the nodes and determines values indicating a next state of the corresponding nodes based on the retained values indicating the state of the nodes and each of the interaction coefficients and values indicating a state of each of other nodes causing interactions with the corresponding nodes; and a connection unit that sends and receives part of the values indicating the state of the nodes, which are retained by a necessary element unit, via the inter-chip wire to and from another semiconductor chip or sends and receives the values indicating state of the nodes, which are retained by the necessary element unit, to and from the other semiconductor chip via the inter-chip wire while sharing the the inter-chip wire by means of time sharing.

With this semiconductor device, necessary values of nodes are sent and received between the semiconductor chips. Accordingly, the wiring amount of the inter-chip wire for connecting the semiconductor chips can be reduced.

According to the present invention, it is possible to implement a semiconductor device that can simulate interactions between nodes of a large-scale interaction model and can be easily manufactured at inexpensive cost.

DETAILED DESCRIPTION OF PREFERRED EMBODIMENTS

An embodiment of the present invention will be described below in detail with reference to the attached drawings.

(1) First Embodiment

(1-1) Ising Model Extended to Directed Graph

In this embodiment, a model extended from an Ising model and represented by the following expression (2) will be hereinafter referred to as the Ising model.

[Math. 2]

$$E(s) = -\sum_{i \neq j} J_{i,j}\sigma_i\sigma_j - \sum_i h_i\sigma_i \quad (2)$$

The difference between the Ising model represented by expression (1) and the model represented by expression (2) is that expression (2) permits interactions as shown in a directed graph. Generally, the Ising model can be drawn as an undirected graph according to graph theory. This is because interactions of the Ising model do not distinguish between an interaction coefficient $J_{i,j}$ from the i-th spin to the j-th spin and an interaction coefficient $J_{j,i}$ from the j-th spin to the i-th spin.

Since the present invention can be applied even by extending the Ising model and distinguishing between $J_{i,j}$ and $J_{j,i}$, the Ising model which is formed into a directed graph is handled in this embodiment. Incidentally, if the Ising model which is an undirected graph is to be handled by using the Ising model which is a directed graph, it can be done simply by defining the same interaction coefficient for two directions, that is, $J_{i,j}$ and $J_{j,i}$. In this case, even if the same model is used, a value of the energy of the energy function according to expression (2) is twice as much as the energy of the energy function according to expression (1).

Figure 1:
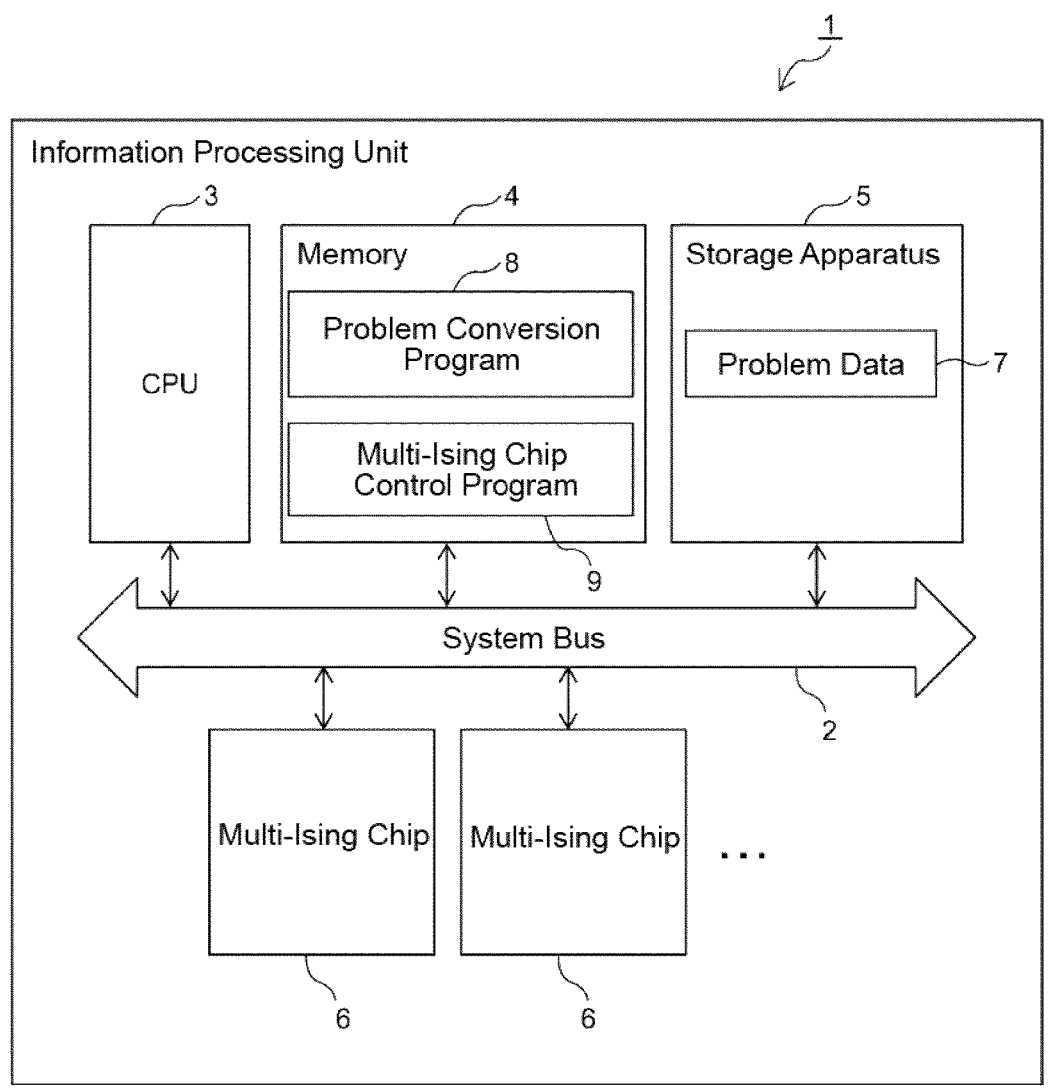
FIG. 1 is a block diagram showing the overall configuration of an information processing unit according to first and second embodiments.

(1-2) Configuration of Information Processing Unit According to this Embodiment (1-2-1) Overall Configuration of Information Processing Unit Referring to FIG. 1, reference numeral 1 represents an information processing unit as a whole according to this embodiment. This information processing unit 1 is composed of, for example, a personal computer, a workstation, or a server; and includes a CPU (Central Processing Unit) 3, a memory 4, a storage apparatus 5, and the plurality of multi-Ising chips 6, which are mutually connected via a system bus 2.

The CPU 3 is a processor that controls operation of the entire information processing unit 1. Furthermore, the memory 4 is composed of, for example, a volatile semiconductor memory and is used to store various programs. The storage apparatus 5 is composed of, for example, hard disk drives or SSDs (Solid State Drives) and is used to retain programs and data for a long period of time.

In a case of this embodiment, the storage apparatus 5 stores problem data 7 which is a single problem to be solved by this information processing unit 1; and the memory 4 stores a problem conversion program 8 and a multi-Ising chip control program 9. The problem conversion program converts such a problem into a single problem of an Ising model format as necessary and divides the problem of the Ising model format into a plurality of partial problems as necessary and assigns these partial problems to individual multi-Ising chips 6, respectively. Furthermore, the multi-Ising chip control program 9 is a program for controlling solving of the partial problems handled by the individual multi-Ising chips 6. Incidentally, a partial problem itself is a single problem of the Ising model format independent from other partial problems.

The multi-Ising chip 6 is dedicated hardware for performing a ground-state search of Ising models and takes a form of an expansion card to be mounted in the information processing unit 1 like a GPU (Graphics Processing Unit) which is dedicated hardware for screen plotting processing.

The multi-Ising chip 6 is configured by including an interface 10, an Ising chip group 11, and a control unit 12 and sends and receives commands and information to and from the CPU 3 (FIG. 1) via the interface 10 and the system bus 2 (FIG. 1).

The Ising chip group 11 is composed of a plurality of Ising chips 13, each of which is a semiconductor chip that simulates interactions between spins of an Ising model. The Ising chips 13 are connected with the inter-chip wire 14 and the Ising chips 13 send and receive necessary data to and from each other via this inter-chip wire 14.

The control unit 12 has a function that controls each of the Ising chips 13 constituting the Ising chip group 11 and is configured by including a controller 15, an interaction clock generator 16, and a random number generator 17.

The controller 15 is a processor for controlling the operation of the entire multi-Ising chip 6 and controls the operation of each of the Ising chips 13 constituting the Ising chip group 11 in accordance with commands sent from the CPU 3 (FIG. 1) for the information processing unit 1 via the system bus 2 (FIG. 1) and the interface 10, and also controls the interaction clock generator 16 and the random number generator 17.

Furthermore, the interaction clock generator 16 is a clock generator that generates an interaction clock described later. The interaction clock generated by the interaction clock generator 16 is sent to each of the Ising chips 13 constituting the Ising chip group 11. The random number generator 17 generates a random number composed of a random bit string to prevent a ground-state search executed by each Ising chip 13 as described later from falling into a local optimal solution. Each random number generated by the random number generator 17 is sent to each Ising chip 13.

(1-2-2) Configuration of Ising Chip

Figure 3:
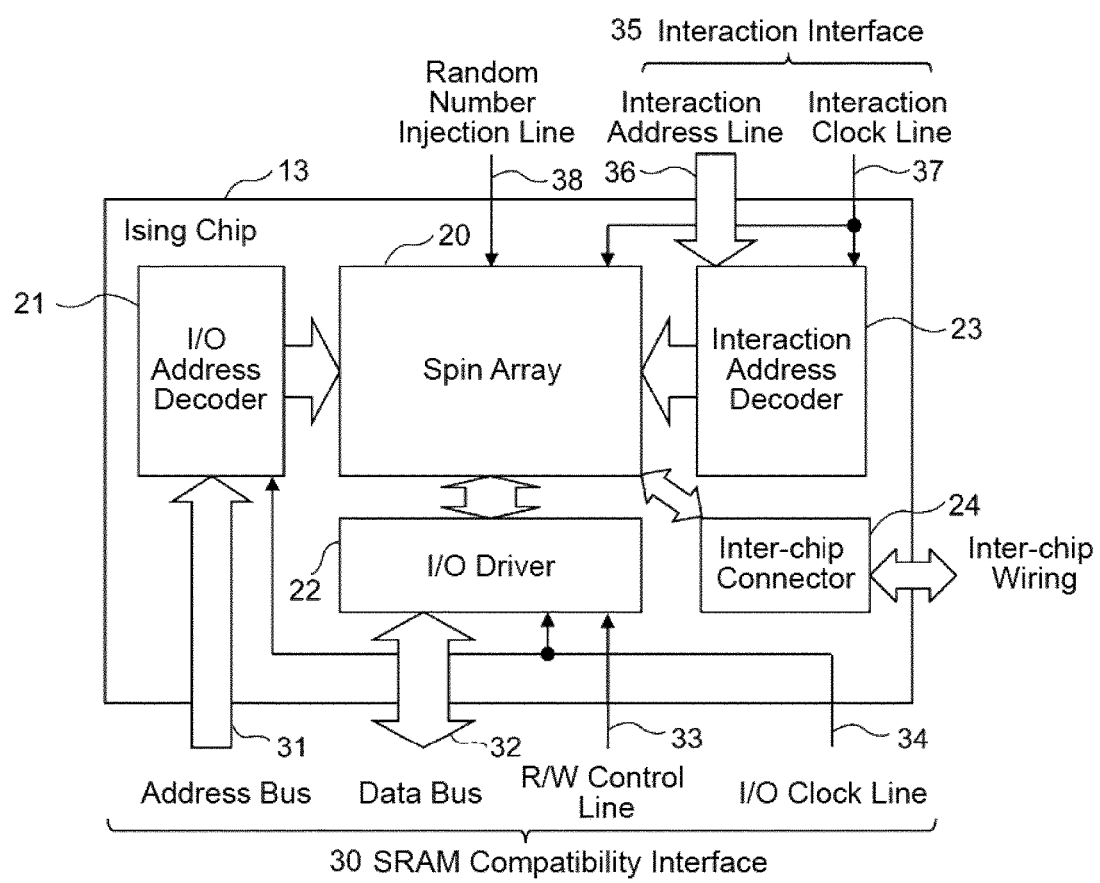
FIG. 3 is a block diagram showing the configuration of an Ising chip.

FIG. 3 shows a schematic configuration of the Ising chip 13. The Ising chip 13 is configured by including a spin array 20, an I/O (Input/Output) address decoder 21, an I/O driver 22, an interaction address decoder 23, and an inter-chip connector 24 as shown in this FIG. 3. This embodiment will be explained by assuming that the Ising chip 13 is mounted as a CMOS (Complementary Metal-Oxide Semiconductor) integrated circuit which is currently widely known; however, other types of solid-state component are also feasible.

The Ising chip 13 includes, as an SRAM compatibility interface 30 for reading/writing data from/to the spin array 20, an address bus 31, a data bus 32, an R/W control line 33, and an I/O clock line 34. The Ising chip 13 also includes, as an interaction control interface 35 for controlling the ground-state search of the Ising model, an interaction address line 36 and an interaction clock line 37.

The Ising chip 13 expresses all of the spin $\sigma_i$, the interaction coefficient $J_{i,j}$, and the external magnetic field coefficient $h_i$ of the Ising model with information stored in memory cells described later in the spin array 20. Setting of an initial state of the spin $\sigma_i$ and reading of a solution after completion of the ground-state search are performed via the SRAM compatibility interface 30. Furthermore, with the Ising chip 13, reading/writing of the interaction coefficient $J_{i,j}$ and the external magnetic field coefficient $h_i$ to set the Ising model, whose ground state should be searched, to the spin array 20 is also performed via the SRAM compatibility interface 30.

Therefore, an address is assigned to the spin $\sigma_i$, the interaction coefficient $J_{i,j}$, and the external magnetic field coefficient $h_i$ of the spin array 20. Then, when the spin $\sigma_i$, the interaction coefficient $J_{i,j}$ or the external magnetic field coefficient $h_i$ is read from or written to the Ising chip 13, the relevant address is given from the controller 15 to the I/O address decoder 21 via the address bus 31 and an R/W control signal for controlling reading/writing of the spin $\sigma_i$, the interaction coefficient $J_{i,j}$, and the external magnetic field coefficient $h_i$ is given from the controller 15 via the R/W control line 33 to the I/O driver 22.

Consequently, the I/O address decoder 21 activates a word line in the spin array 20 based on the address given via the address bus 31 and the I/O driver 22 activates a corresponding bit line in the spin array 20 based on the R/W control signal given via the R/W control line 33. As a result, an initial value of the spin $\sigma_i$ and set values of the interaction coefficient $J_{i,j}$ and the external magnetic field coefficient $h_i$ are set to the spin array 20 or the solution after completion of the ground-state search is read from the spin array 20 and output externally via the data bus 32.

Incidentally, the address bus 31, the data bus 32, and the R/W control line 33 which constitute the SRAM compatibility interface 30 operate in synchronization with an I/O clock sent from the control unit 12 to the Ising chip 13 via the I/O clock line 34. However, according to the present invention, the interface does not have to be synchronous and may be asynchronous. This embodiment will be explained on the premise that the interface is synchronous.

Furthermore, the Ising chip 13 implements interactions between spins within the spin array 20 in order to perform the ground-state search. The interaction control interface 35 is used to control such interactions from outside. Specifically speaking, the Ising chip 13 inputs the address, which is given from the controller 15 to designate a spin group for performing the interaction, via the interaction address line 36 and performs the interaction in synchronization with the interaction clock which is input from the interaction clock generator 16 via the interaction clock line 37. The interaction address decoder 23 reads/writes the interaction coefficient $J_{i,j}$ and the external magnetic field coefficient $h_i$ from/to the spin array 20 based on the address given via the interaction address line 36.

In addition, the Ising chip 13 includes a random number injection line 38 that injects a random number to stochastically invert a value of a memory cell which represents spins in the Ising model as described later. The random number generated by the random number generator 17 described earlier with reference to FIG. 2 is supplied via this random number injection line 38 to the spin array 20.

The inter-chip connector 24 functions as an interface when sending/writing the value of spin $\sigma_i$ which is necessary between the Ising chips 13 located adjacent to each other. The details of the inter-chip connector 24 will be described later.

(1-2-3) Configuration of Spin Array

The spin array 20 is configured so that numerous spin units are arranged as element units where each spin unit retains one spin $\sigma_i$ and its associated interaction coefficient $J_{i,j}$ and external magnetic field coefficient $h_i$ and implements ground-state search operation.

Figure 4:
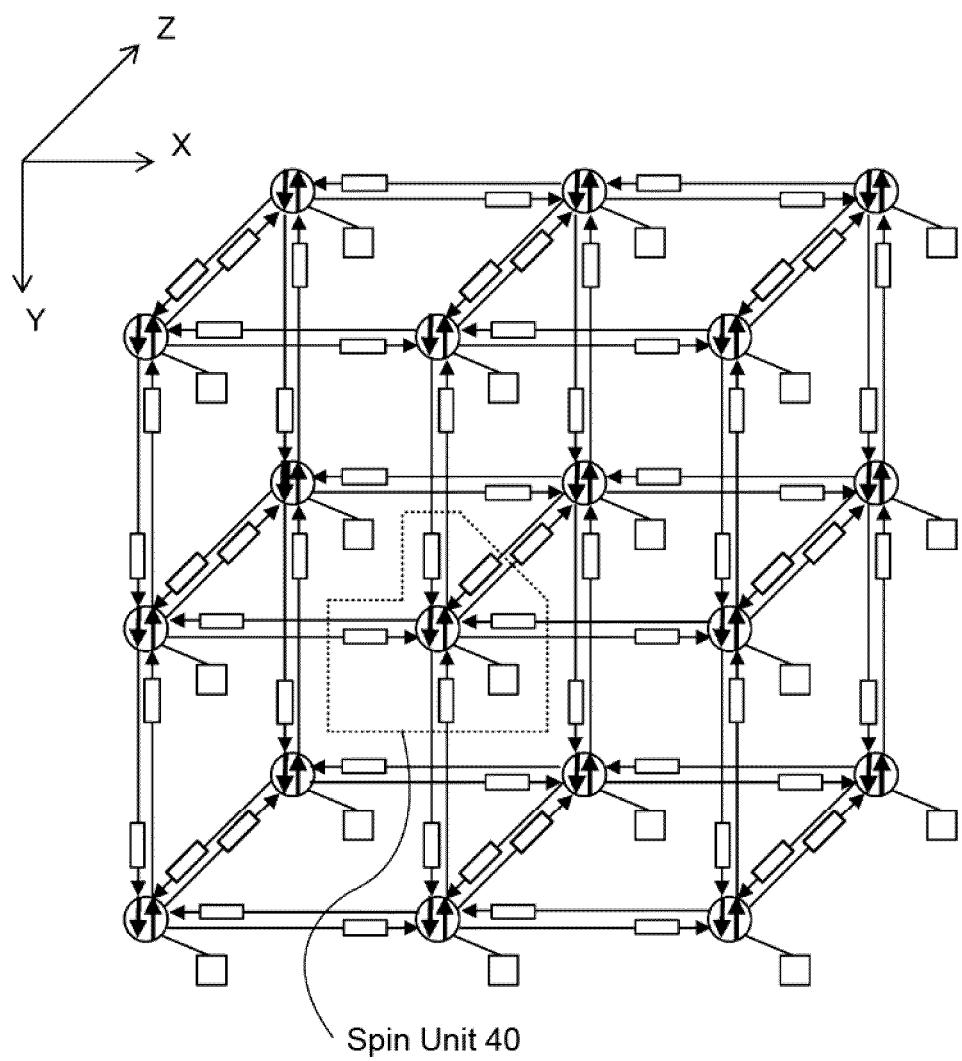
FIG. 4 is a conceptual diagram for explaining an Ising model.

FIG. 4 shows an example in which an Ising model having a three-dimensional lattice topology is configured by arranging a plurality of spin units 40. The example in FIG. 4 is a three-dimensional lattice of a 3 (X-axis direction)×3 (Y-axis direction)×2 (Z-axis direction) size. Coordinate axes are defined as illustrated in the drawing so that the right direction in the drawing is an X-axis, the downward direction in the drawing is a Y-axis, and the depthwise direction in the drawing is a Z-axis; however, these coordinate axes are defined as necessary merely for the convenience of easy explanation of the embodiment and are irrelevant to the present invention. If a topology other than the three-dimensional lattice such as a tree-shaped topology is used, for example, the number of steps of the tree will be used to represent positions separately from the coordinate axes. If interactions between the spins are interpreted as a graph in the three-dimensional-lattice-shaped topology in FIG. 4, a spin of order 5 at maximum (vertex) will be required. Incidentally, if connection of the external magnetic field coefficient is also taken into consideration, degree 6 at maximum will be required.

Values of adjacent spins (for example, in a case of five adjacent spins $\sigma_j, \sigma_k, \sigma_l, \sigma_m, \sigma_n$) are input to one spin unit 40 shown in FIG. 4. Therefore, the spin unit 40 has memory cells to retain these adjacent spin values to be input. The spin unit 40 also has memory cells to retain, in addition to the above-mentioned spin values, the external magnetic field coefficient and interaction coefficients with the above-mentioned adjacent spins (the interaction coefficients $J_{j,i}, J_{k,i}, J_{l,i}, J_{m,i}, J_{n,i}$ with the five adjacent spins), respectively.

Meanwhile, an Ising model has interactions generally represented by an undirected graph as described earlier. The aforementioned expression (1) includes $J_{i,j} \times \sigma_i \sigma_j$ as a term representing an interaction, which indicates an interaction from the i-th spin to the j-th spin. In this case, a general Ising model does not distinguish between the interaction from the i-th spin to the j-th spin and an interaction from the j-th spin to the i-th spin. In other words, $J_{i,j}$ and $J_{j,i}$ the same. However, with the Ising chip 13 according to this embodiment, this Ising model is extended to a directed graph (expression (2)) as described earlier and realizes asymmetric interactions, that is, the interaction from the i-th spin to the j-th spin and the interaction from the j-th spin to the i-th spin. As a result, model representation capability enhances, thereby making it possible to represent many problems with small-scale models.

Therefore, if one spin unit is the i-th spin $\sigma_i$, the interaction coefficients $J_{j,i}, J_{k,i}, J_{l,i}, J_{m,i}, J_{n,i}$ retained by this spin unit 40 determine interactions from the adjacent j-th, k-th, l-th, m-th, and n-th spins $\sigma_j, \sigma_k, \sigma_l, \sigma_m, \sigma_n$ to the i-th spin $\sigma_i$. This corresponds to the fact that arrows (interactions) corresponding to the interaction coefficients included in the spin unit 40 in FIG. 4 are directed from spins outside the spin unit 40 shown in the drawing towards spins inside the spin unit 40.

(1-2-4) Configuration of Spin Unit

Figure 7:
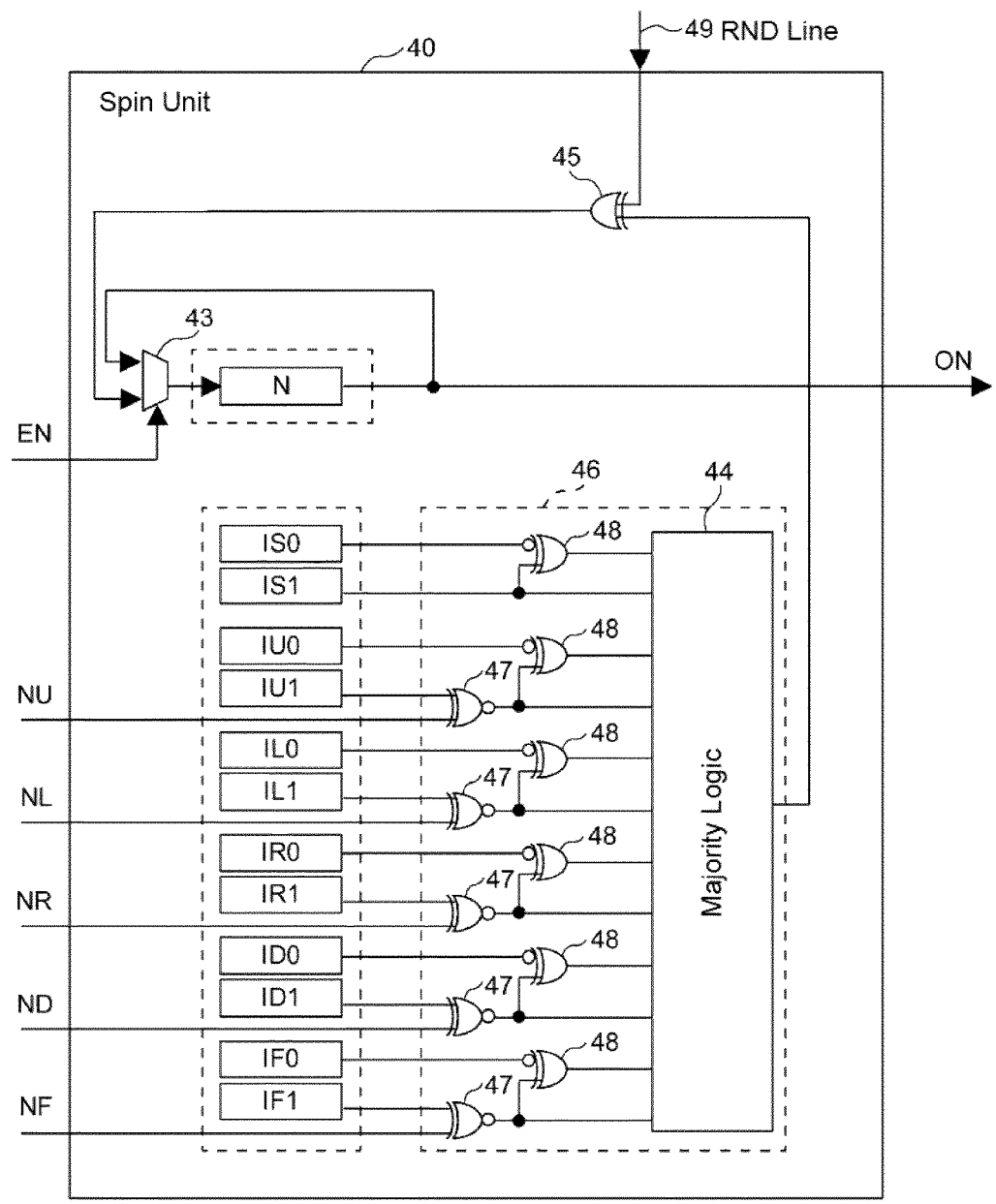
FIG. 7 is a block diagram showing the configuration of a spin unit according to the first embodiment.
Figure 8:
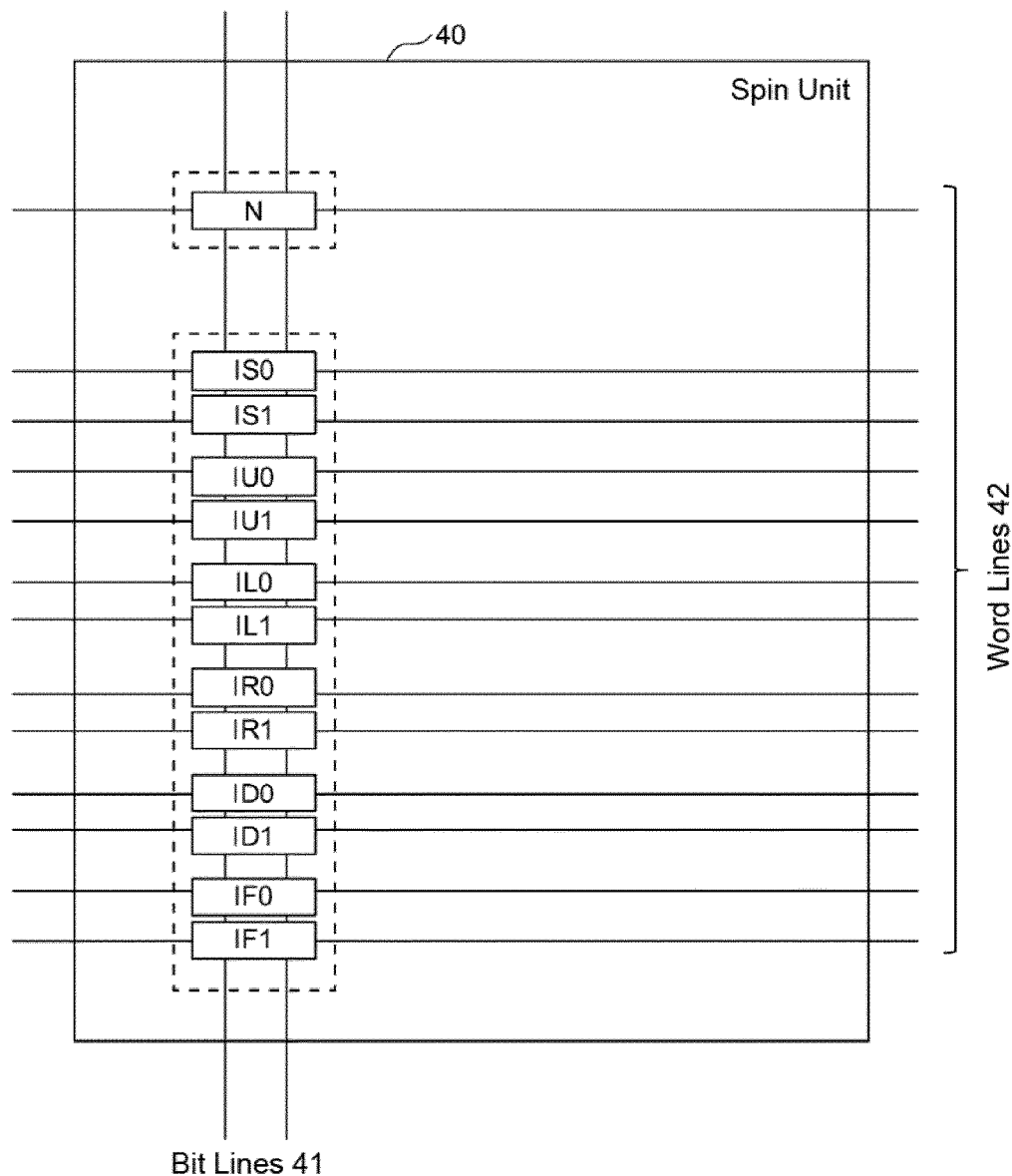
FIG. 8 is a block diagram showing the configuration of the spin unit according to the first embodiment.

A configuration example of the spin unit 40 will be described with reference to FIG. 7 and FIG. 8. The spin unit 40 has two sides, which will be explained separately by using FIG. 7 and FIG. 8 as a matter of convenience; however, one spin unit 40 includes both configurations of FIG. 7 and FIG. 8. FIG. 7 illustrates a circuit for implementing interactions within the spin unit 40 and FIG. 8 illustrates the configuration of the spin unit 40 by focusing on the bit lines 41 and the word lines 42 which are interfaces for accessing memory cells N, IS0, IS1, IU0, IU1, IL0, IL1, IR0, IR1, ID0, ID1, IF0, IF1 included in the spin unit 40 from outside the Ising chip 13.

The spin unit 40 includes a plurality of 1-bit memory cells N, IS0, IS1, IU0, IU1, IL0, IL1, IR0, IR1, ID0, ID1, IF0, IF1 for retaining the spin $\sigma_i$, the interaction coefficients $J_{j,\,i}$, to $J_{n,\,i}$, and the external magnetic field coefficient $h_i$ of the Ising model. Incidentally, two memory cells serve their role as a pair as follows: the memory cells IS0 and IS1, the memory cells IU0 and IU1, the memory cells IL0 and IL1, the memory cells IR0 and IR1, the memory cells ID0 and ID1, and the memory cells IF0 and IF1. So, they will be hereinafter collectively referred to as the memory cell pair ISx, IUx, ILx, IRx, IDx, or IFx (see FIG. 5).

Now, the spin unit 40 will be described as a spin unit that represents the i-th spin. The memory cell N is a memory cell to represent a spin and retains a spin value. The spin value is +1/−1 (+1 may be expressed as up and −1 may be expressed as down) in the Ising model and this is made to correspond to 0/1 which is a binary value retainable by the memory cell. For example, +1 corresponds to 1 and −1 corresponds to 0.

Figure 5:
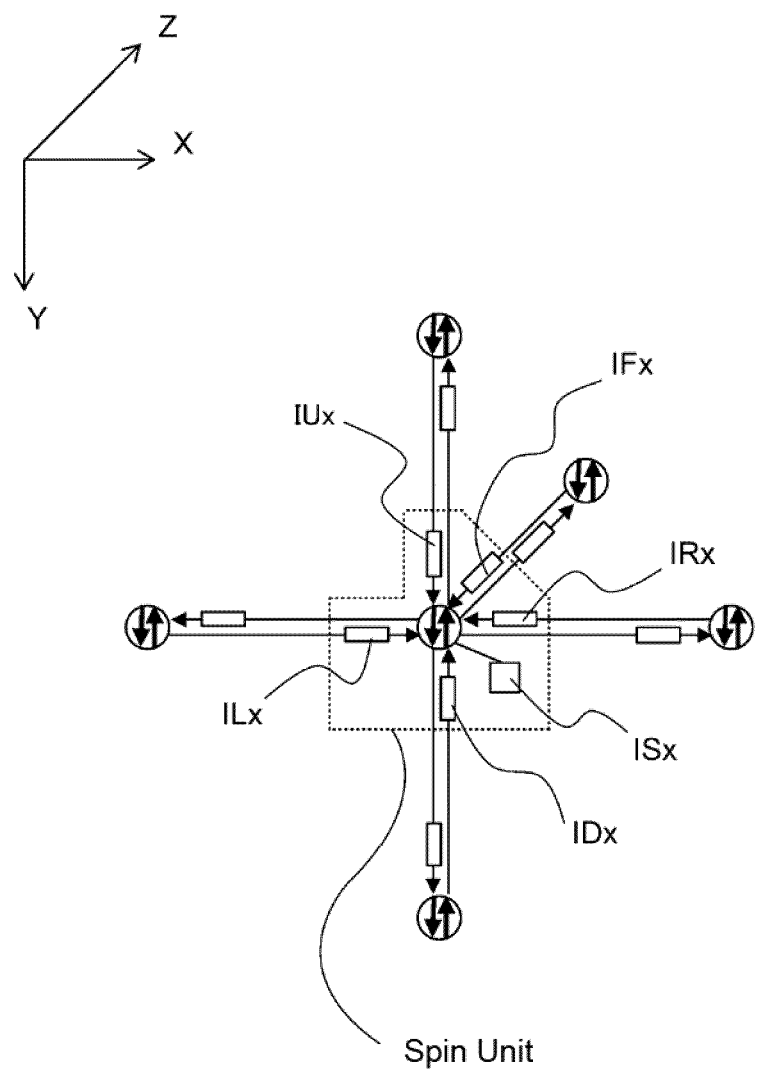
FIG. 5 is a conceptual diagram for explaining a spin unit.

FIG. 5 is used to show a correspondence relationship between the memory cell pairs ISx, IUx, ILx, IRx, IDx, and IFx of the spin unit 40 and the topology of the Ising model shown in FIG. 4. The memory cell pair ISx stores the external magnetic field coefficient. Furthermore, each of the memory cell pairs IUx, ILx, IRx, IDx, and IFx stores an interaction coefficient. Specifically speaking, the memory cell pair IUx stores an interaction coefficient with an upper-side spin (−1 in the Y-axis direction); the memory cell pair ILx stores an interaction coefficient with a left-side spin (−1 in the X-axis direction); the memory cell pair IRx stores an interaction coefficient with a right-side spin (+1 in the X-axis direction); the memory cell pair IDx stores an interaction coefficient with a down-side spin (+1 in the Y-axis direction); and the memory cell pair IFx stores an interaction coefficient with a spin connected in a depthwise direction (+1 or −1 in the Z-axis direction).

Furthermore, if the Ising model is recognized as a directed graph and is seen from a certain spin, other spins have coefficients that influence the relevant spin. The coefficients by which the relevant spin influence the other spins belong to the respective other spins. Specifically speaking, this spin unit 40 is connected to five spins at maximum. With the Ising chip 13 according to this embodiment, the external magnetic field coefficient and the interaction coefficients correspond to three values, +1/0/−1. Therefore, a 2-bit memory cell is required to represent each of the external magnetic field coefficient and the interaction coefficients.

The memory cell pairs ISx, IUx, ILx, IRx, IDx, and IFx represent the three values +1/0/−1 by using a combination of two memory cells whose number at the end of their reference signs is 0 or 1 (for example, in a case of the memory cell pair ISx, the memory cells IS0 and IS1). For example, in the case of the memory cell pair ISx, the memory cell IS1 represents +1/−1; and when a value retained by the memory cell IS1 is 1, it represents +1; and when the value retained by the memory cell IS1 is 0, it represents −1.

In addition, when the value retained by the memory cell IS0 is 0, the external magnetic field coefficient is recognized as 0; and the value retained by the memory cell IS0 is 1, either of +1/−1 determined by the value retained by the memory cell IS1 is recognized as the external magnetic field coefficient. When the external magnetic field coefficient is 0 and if it is assumed that the external magnetic field coefficient is disabled, you can say that the value retained by the memory cell IS0 is an enable bit of the external magnetic field coefficient (the external magnetic field coefficient is enabled when IS0 is 1). Similarly, the memory cell pairs IUx, ILx, IRx, IDx, and IFx which store the interaction coefficients have the coefficients and the bit values correspond to each other.

Each of the memory cells N, IS0, IS1, IU0, IU1, IL0, IL1, IR0, IR1, ID0, ID1, IF0, and IF1 in the spin unit 40 must be designed so that data can be read from or written to it from outside the Ising chip 13. Therefore, each spin unit 40 has the bit lines 41 and the word lines 42 as shown in FIG. 8.

Figure 9:
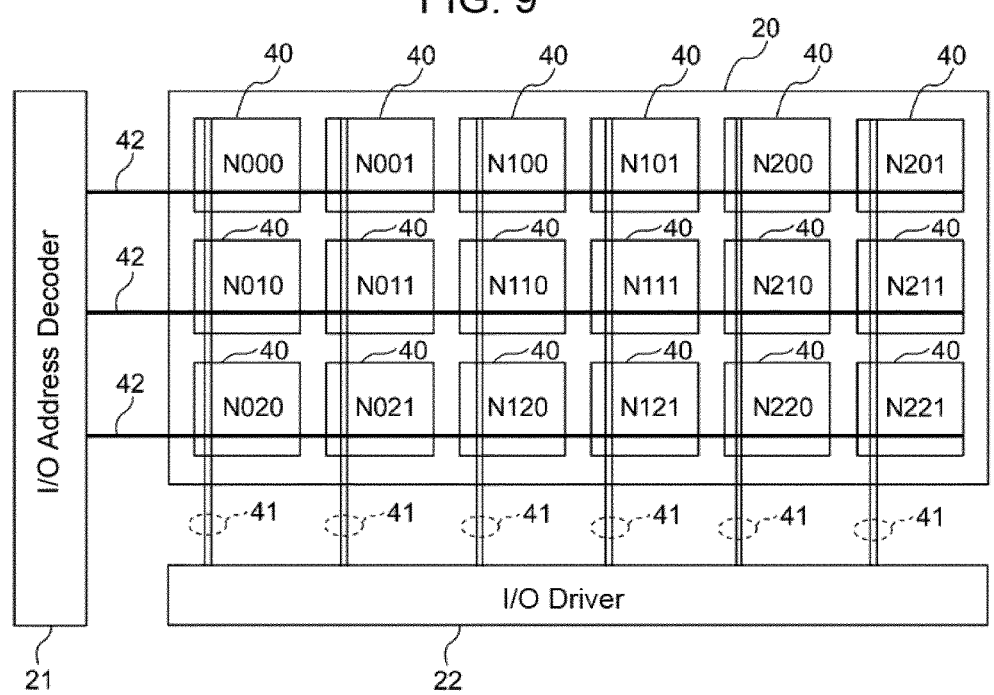
FIG. 9 is a block diagram showing an arrangement example of spin units on an Ising chip.

Then, with the Ising chip 13 as shown in FIG. 9, the respective spin units 40 are arranged in a tile-like manner on a semiconductor substrate and are connected to the bit lines 41 and the word lines 42; and data can be read or written to the memory cells in each spin unit 40 via the SRAM compatibility interface 30 of the Ising chip 13 in the same manner as in a case of a general SRAM by driving, controlling, or reading the spin units 40 using the I/O address decoder 21 and the I/O driver 22.

Figure 6:
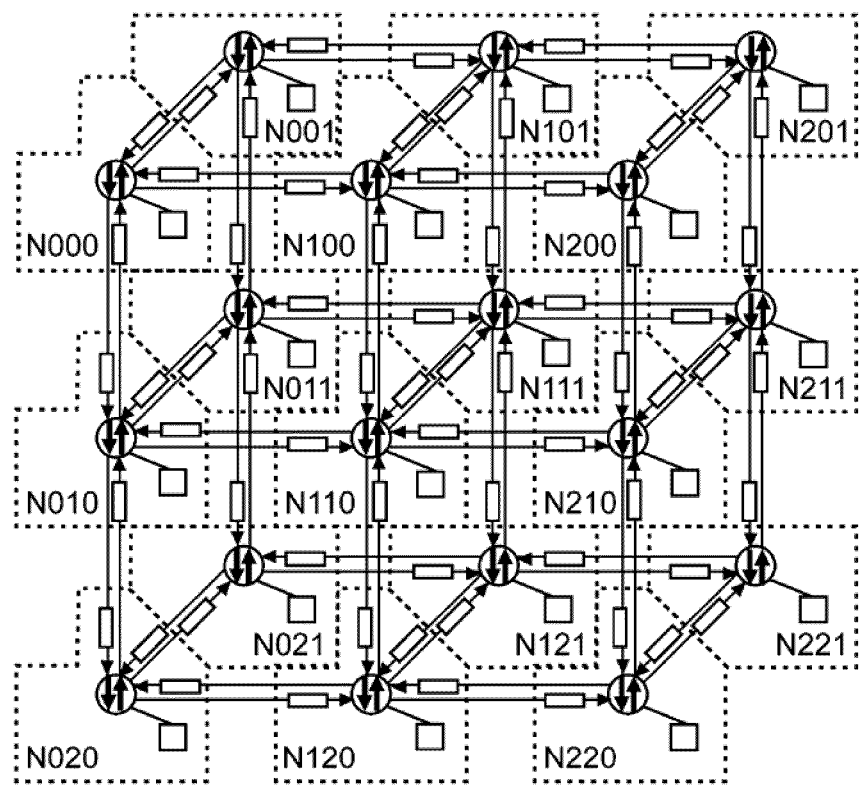
FIG. 6 is a conceptual diagram for explaining a spin unit.

Incidentally, FIG. 6 shows which vertexes in the topology of the three-dimensional lattice the spin units represented in FIG. 9 (the reference sing is assigned as, for example, Nxyz according to the position on the X-axis, the Y-axis, and the Z-axis) correspond to. Each lattice vertex is located as if to insert each lattice vertex of an Z-axis-directional lattice vertex array into a space between X-axis-directional lattice vertex arrays in order to locate the 3×3×2 three-dimensional lattice vertexes on a two-dimensional plane. Specifically speaking, while Nx0z, Nx1z, Nx2z, and so on are located in the Y-axis direction (the down-side of the drawing is the Y-axis positive direction) on the two-dimensional plane in FIG. 9, spin units whose Z-axis direction coordinates are 0 and 1 are located alternately like N0y0, N0y1, N1y0, N1y1, N2y0, N2y1, and so on in the X-axis direction (the right side of the drawing is the X-axis positive direction).

Furthermore, since the spin units 40 are updated at the same time, each spin unit 40 independently has a circuit for deciding the state of the next spin by calculating interactions. Referring to FIG. 7, the spin unit 40 has signal lines EN, NU, NL, NR, ND, NF, ON, and RND as interfaces with outside the spin unit 40. The signal line EN is an interface for inputting a switching signal which permits updates of spins of the relevant spin unit 40. By controlling a selector 40 using this switching signal, the spin value retained by the memory cell N can be updated to a value given from a majority logic circuit 44 described later via an OR circuit 45 to the selector 43.

The signal line ON is an interface for outputting the spin value retained by the relevant spin unit 40 to other spin units 40 (adjacent units in the topology in FIG. 4). Each of the signal lines NU, NL, NR, ND, and NF is an interface for inputting a spin value retained by each of the other spin units 40 (the adjacent units in the topology in FIG. 4). The signal line NU receives input from the upper-side spin (−1 in the Y-axis direction); the signal line NL receives input from the left-side spin (−1 in the X-axis direction); the signal line NR receives input from the right-side spin (+1 in the X-axis direction); the signal line ND receives input from the down-side spin (+1 in the Y-axis direction); and the signal line NF receives input from the spin connected in the depthwise direction (+1 or −1 in the Z-axis direction).

Regarding the spin unit 40, the next state of the relevant spin is determined so as to minimize energy between the adjacent spins. This is equivalent to judging either one of a positive value and a negative value is controlling with respect to a product of the adjacent spins and the interaction coefficients and the external magnetic field coefficient. For example, assuming that the spins $\sigma_j$, $\sigma_k$, $\sigma_l$, $\sigma_m$, and $\sigma_n$ are adjacent to the i-th spin $\sigma_i$, the next state of the spin $\sigma_i$ is determined as described below.

Firstly, it is assumed that values of the adjacent spins are $\sigma_j=+1$, $\sigma_k=-1$, $\sigma_l=+1$, $\sigma_m=-1$, and $\sigma_n=+1$, the interaction coefficients are $J_{j,i}=+1$, $\sigma_{k,i}=+1$, $J_{l,i}=+1$, $J_{m,i}=-1$, and $J_{n,i}=-1$, and the external magnetic field coefficient is $h_i=+1$. Products of the interaction coefficients and the adjacent spins and the external magnetic field coefficient under this circumstance are as follows: $\sigma_j \times J_{j,i}=+1$, $\sigma_k \times J_{k,i}=-1$, $\sigma_l \times J_{l,i}=+1$, $\sigma_m \times J_{m,i}=+1$, $\sigma_n \times J_{n,i}=-1$, and $h_i=+1$. The external magnetic field coefficient may be considered as an interaction coefficient with a spin whose value is always +1.

Now, local energy between the i-th spin and the adjacent spins is obtained by multiplying each of the aforementioned coefficients by the i-th spin value and further inverting the sign. For example, the local energy with the j-th spin becomes: −1 when the i-th spin is +1; and +1 when the i-th spin is −1. So, the spins work in a direction to reduce the local energy under this circumstance when the i-th spin is +1.

When thinking about the local energy with respect to the external magnetic field coefficient between all the adjacent spins, the calculation is performed to find out which value of the i-th spin, either +1 or −1, can reduce the energy. This may be done simply by counting the number of the values +1 and −1 to see which is larger the number of +1 or the number of −1 when the aforementioned products of the interaction coefficients and the adjacent spins and the external magnetic field coefficient are listed. In the aforementioned example, there are four +1 and two −1. If the i-th spin is +1, a sum of energy will be −2; and if the i-th spin is −1, the sum of energy will be +2. Therefore, the next state of the i-th spin to minimize the energy can be determined by a majority of the spin values, that is, by deciding the next state of the i-th spin as +1 when the number of +1 is larger, and as −1 when the number of −1 is larger.

The logical circuit 46 shown in FIG. 7 is a circuit for performing the above-described interactions. Firstly, an XNOR circuit 47 is used to find an exclusive NOR (XNOR) of the state of the adjacent spins and the values retained by the memory cells IU1, IL1, IR1, ID1, IF1 which indicate the interaction coefficients +1/−1. Accordingly, the next state of the relevant spin to minimize the energy can be calculated merely by considering its interactions (it is assumed that +1 is encoded as 1 and −1 is encoded as 0).

If the interaction coefficients are only +1/−1, the next state of the relevant spin can be determined by a majority logic, that is, by having a majority logic circuit 44 judge which is larger the number of +1 or the number of −1 among outputs from the XNOR circuit 47. Regarding the external magnetic field coefficient, assuming that it corresponds to an interaction coefficient with a spin whose state is always +1, simply the value of the external magnetic field coefficient becomes a value that should be input to the majority logic circuit 44 which determines the next state of the spin.

Next, a method of realizing the coefficient 0 will be discussed. When there is a majority logic f with n input (I1, I2, I3, and so on up to In), the following proposition can be recognized as true. Firstly, it is assumed that there are duplicates I'1, I'2, I'3, and so on up to I'n of inputs I1, I2, I3, and so on up to In (Ik=I'k for arbitrary k). Under this circumstance, output from f (I1, I2, I3, and so on up to In) is equivalent to that of f to which the duplicates are also input (I1, I2, I3, and so on up to In and I'1, I'2, I'3, and so on up to I'n). In other words, even if two values are input as each input variable, the output will be invariant. Furthermore, it is assumed that, besides the inputs I1, I2, I3, and so on up to In, another input Ix and its inverted value IIx exist. Under this circumstance, output from f (I1, I2, I3, and so on up to In, Ix, IIx) is equivalent to that of f (I1, I2, I3, and so on up to In). Specifically speaking, when the input variables and their inverted values are input, the function works to cancel influences of the input variables by a majority. The coefficient 0 is realized by making use of this property of the majority logic.

Specifically speaking, as shown in FIG. 7, a duplicate of a candidate value of the next state of the relevant spin as mentioned above or its inverted value is simultaneously input to the majority logic circuit 44, depending on a value of the bit which determines enabling of the coefficient (the bit retained in each of the bit cells IS0, IU0, IL0, IR0, ID0, and IF0), by using the XOR circuit 48. For example, if a value of the bit retained by the memory cell IS0 is 0, the value of the bit retained in the memory cell IS1 and a value obtained by inverting the value of the bit retained by the memory cell IS1 are simultaneously input to the majority logic circuit 44. So, there will be no influence of the external magnetic field coefficient (the external magnetic field coefficient corresponds to 0). Furthermore, if the value of the bit retained by the memory cell IS0 is 1, the value of the bit retained by the memory cell IS1 and the same value (duplicate) as the above value are input simultaneously to the majority logic circuit 44.

The ground-state search of the applied Ising model can be realized by energy minimization by means of interactions between the aforementioned spins, but performing only the ground-state search might result in a local optimal solution. Basically, there are only movements in a direction to reduce the energy. So, once the calculation results in the local optimal solution, it is impossible to get out of it and reach a global optimal solution. Accordingly, since the value of the memory cell, which represents spins, is stochastically inverted as an action to escape from the local optimal solution, the spin unit 40 includes an RND line 49 as an interface.

Then, the random number supplied from the random number generator 17 (FIG. 2) via this random number injection line 38 (FIG. 3) to the spin array 20 (FIG. 3) as mentioned earlier is supplied via this RND line 49 to the spin unit 40 and this random number is input to the OR circuit 45, thereby stochastically inverting the spin value.

Figure 10:
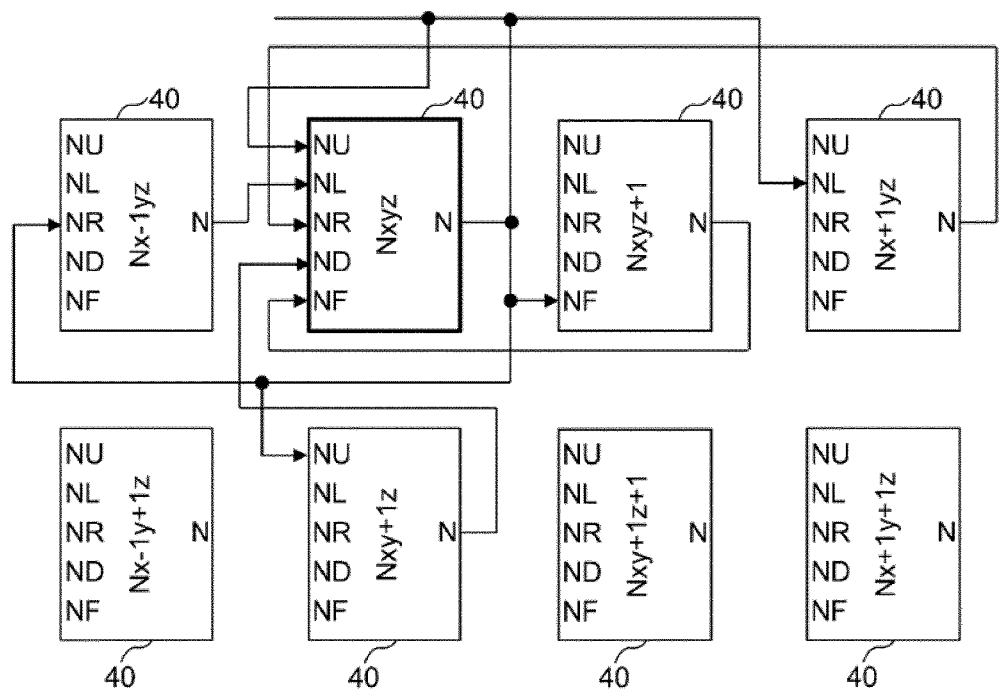
FIG. 10 is a block diagram showing an example of an inter-chip wire.

Incidentally, FIG. 10 shows an example of wiring between the spin units 40 of NU, NL, NR, ND, and NF which are interfaces of the spin unit 40 shown in FIG. 7. This FIG. 10 illustrates the wiring necessary to implement the topology as shown in FIG. 4 in the spin unit arrangement as shown in FIG. 9 when focusing on one certain spin unit 40 called "Nxyz." The topology in FIG. 4 can be implemented by performing such wiring for each spin unit 40.

(1-3) Method of Wiring Between Ising Chips in Multi-Ising Chip

Next, a method of wiring between the Ising chips 13 (FIG. 2) in the multi-Ising chip 6 (FIG. 1) will be explained.

If a large number of spin units 40 are to be mounted on a single Ising chip 13, the chip size of the Ising chip 13 increases, thereby resulting in a cost increase. Therefore, when mounting a large number of spin units on the multi-Ising chip 6, a method of mounting a plurality of Ising chips 13 on the multi-Ising chip 6 and connecting them via the inter-chip wire is effective in order to prevent a cost increase.

Figure 11:
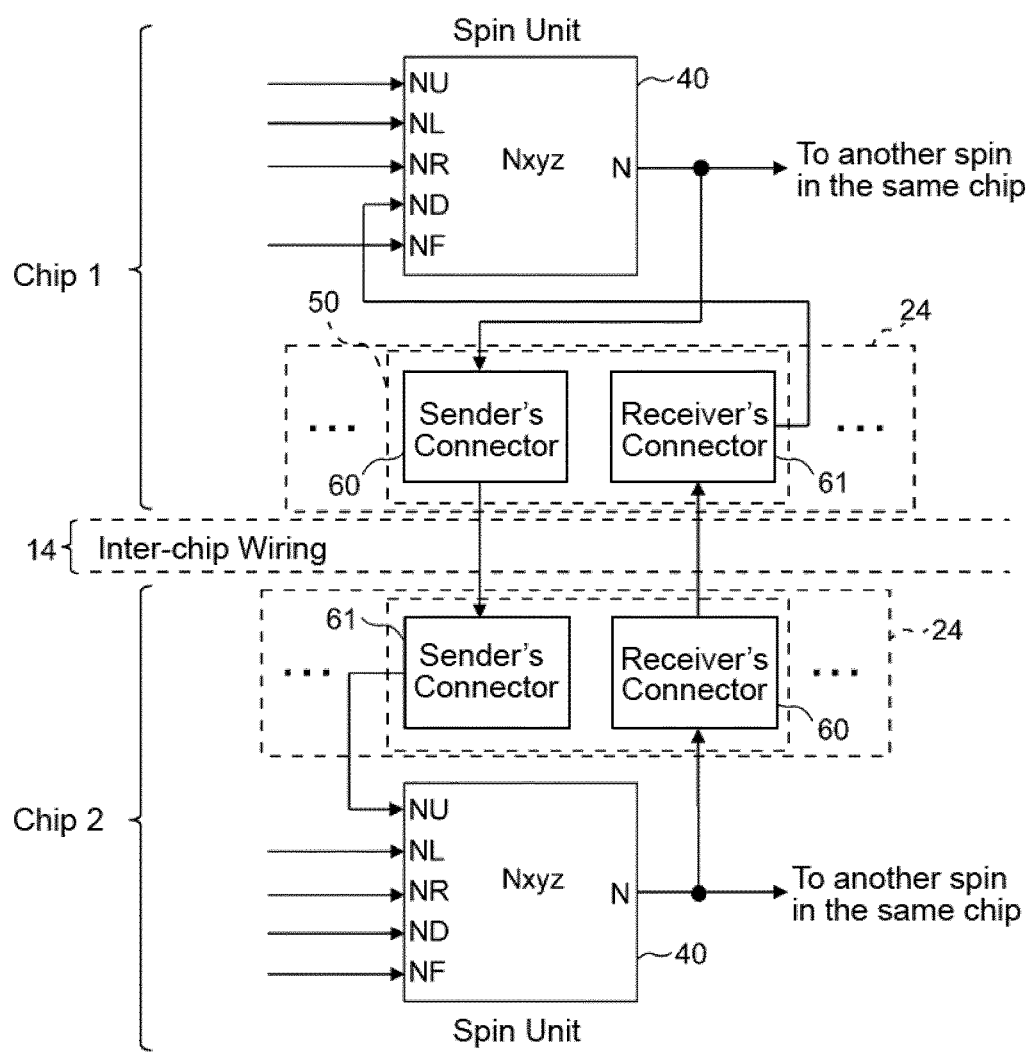
FIG. 11 is a block diagram for explaining connections between Ising chips.

In this case, in order to provide the wiring of the pattern described with reference to FIG. 10 between the spin units 40 placed at the ends of the Ising chip 13 and their corresponding spin units 40 in another Ising chip 13, it is necessary to connect the corresponding spin units 40 provided at the chip ends of the respective adjacent Ising chips 13 via the connection unit 50, which constitutes part of the inter-chip connector 24 (FIG. 3), and the inter-chip wire 14, for example, as shown in FIG. 11. Incidentally, the "spin units 40 provided at the chip ends" herein used mean the spin units 40 which retain adjacent spin values in the Ising model in FIG. 4 and are provided in another Ising chip 13.

Figure 12:
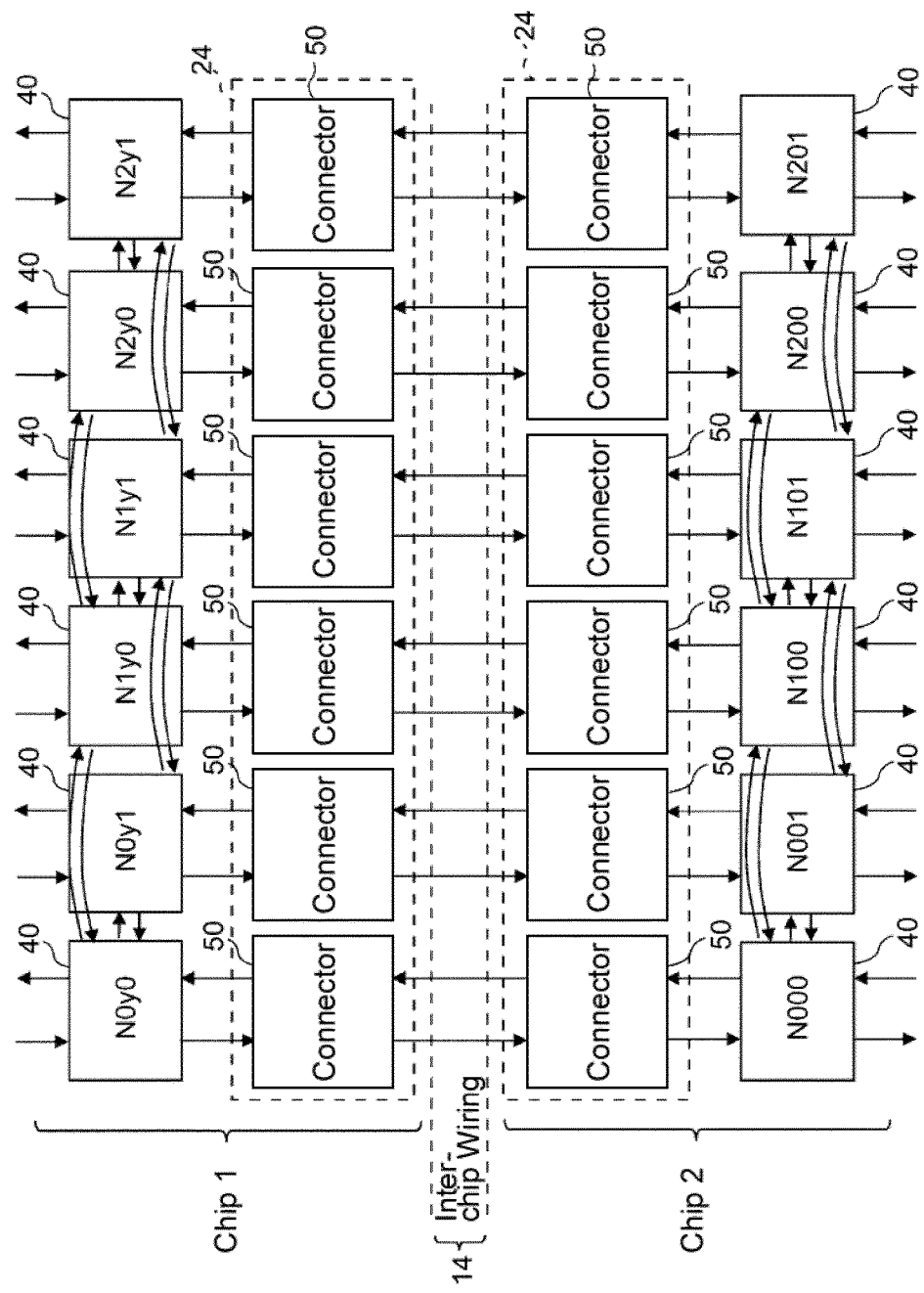
FIG. 12 is a block diagram for explaining connections between Ising chips.

However, for example, if the connection units 50 and the inter-chip wire 14 (FIG. 2) are formed to connect all the corresponding spin units 40 provided at the chip ends of the adjacent Ising chips 13 as shown in FIG. 12, the number of the connection units 50 and the wiring amount of the inter-chip wire 14 will increase too much, thereby causing a cost increase and difficulty in implementation.

So, in this embodiment, when transmitting spin values of the respective spin units 40 provided at the chip end of the Ising chip 13 to its adjacent the Ising chip 13, only some spin values of the necessary spin values are transmitted to the adjacent Ising chip 13 or N−1 pieces or less of the inter-chip wire 14 are provided for N (positive integer number) spin units 40 and these pieces of the inter-chip wire 14 are shared by means of time sharing, so that the wiring amount of the inter-chip wire 14 between the adjacent Ising chips 13 can be reduced without significantly lowering the precision of the ground-state search.

Figure 13:
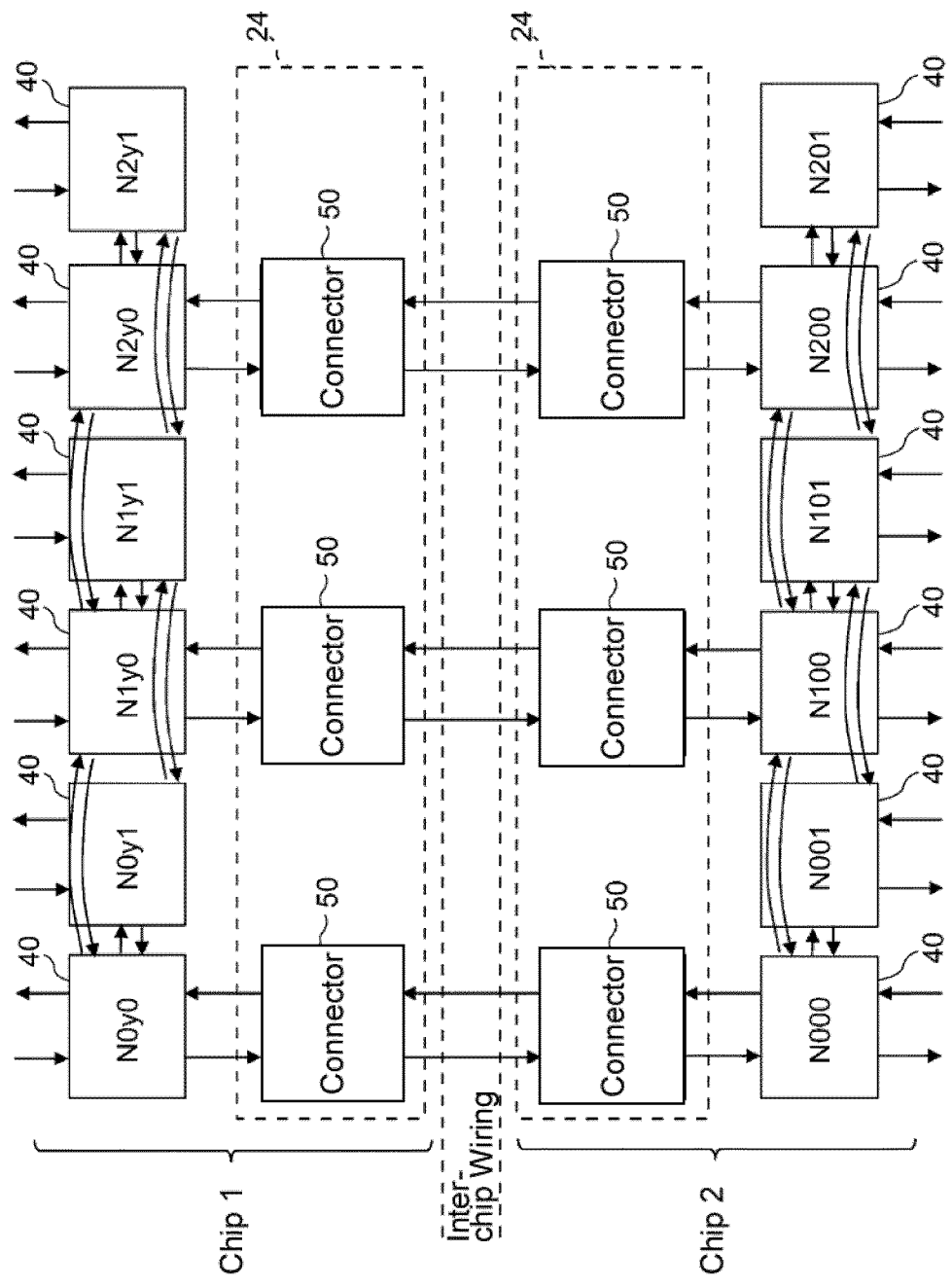
FIG. 13 is a block diagram for explaining a method for parallel transmission of only some spin values between the Ising chips.

FIG. 13 shows a configuration example of a case where the connection units 50 and the inter-chip wire 14 are formed to parallel-transmit only some spin values retained by the respective spin units 40 provided at the chip end of the Ising chip 13 to the corresponding Ising chip 13.

In this example of FIG. 13, the connection unit 50 is provided corresponding to every other spin unit 40 among the respective spin units 40 provided at the chip end of the Ising chip 13 so that the connection unit 50 sends and receives the spin values to and from the corresponding spin units 40 in another adjacent Ising chip 13. This connection unit 50 is composed of a sender's connection unit (hereinafter referred to as the sender connector) 60 and a receiver's connection unit (hereinafter referred to as the receiver connector) 61 as described earlier with reference to FIG. 11.

Then, the inter-chip wire 14 is provided between the Ising chips 13 to connect the sender connector 60 provided on one Ising chip 13 and the corresponding receiver connector 61 provided on the other Ising chip 13 and to connect the receiver connector 61 provided on the one Ising chip 13 and the sender connector 60 provided on the other Ising chip 13.

If such a configuration is used, the spin units 40, among the spin units 40 provided at the chip end of the Ising chip 13, in which the corresponding connection unit 50 is not provided cannot obtain the spin values from the corresponding spin units 40 in the adjacent Ising chip 13. However, even in that case, such spin units 40 can obtain other necessary spin values from other spin units 40, so that the precision of the ground-state search as the entire multi-Ising chip 6 will not be reduced. Also, by doing so, the wiring amount between the adjacent Ising chips 13 can be reduced to ½.

Figure 14:
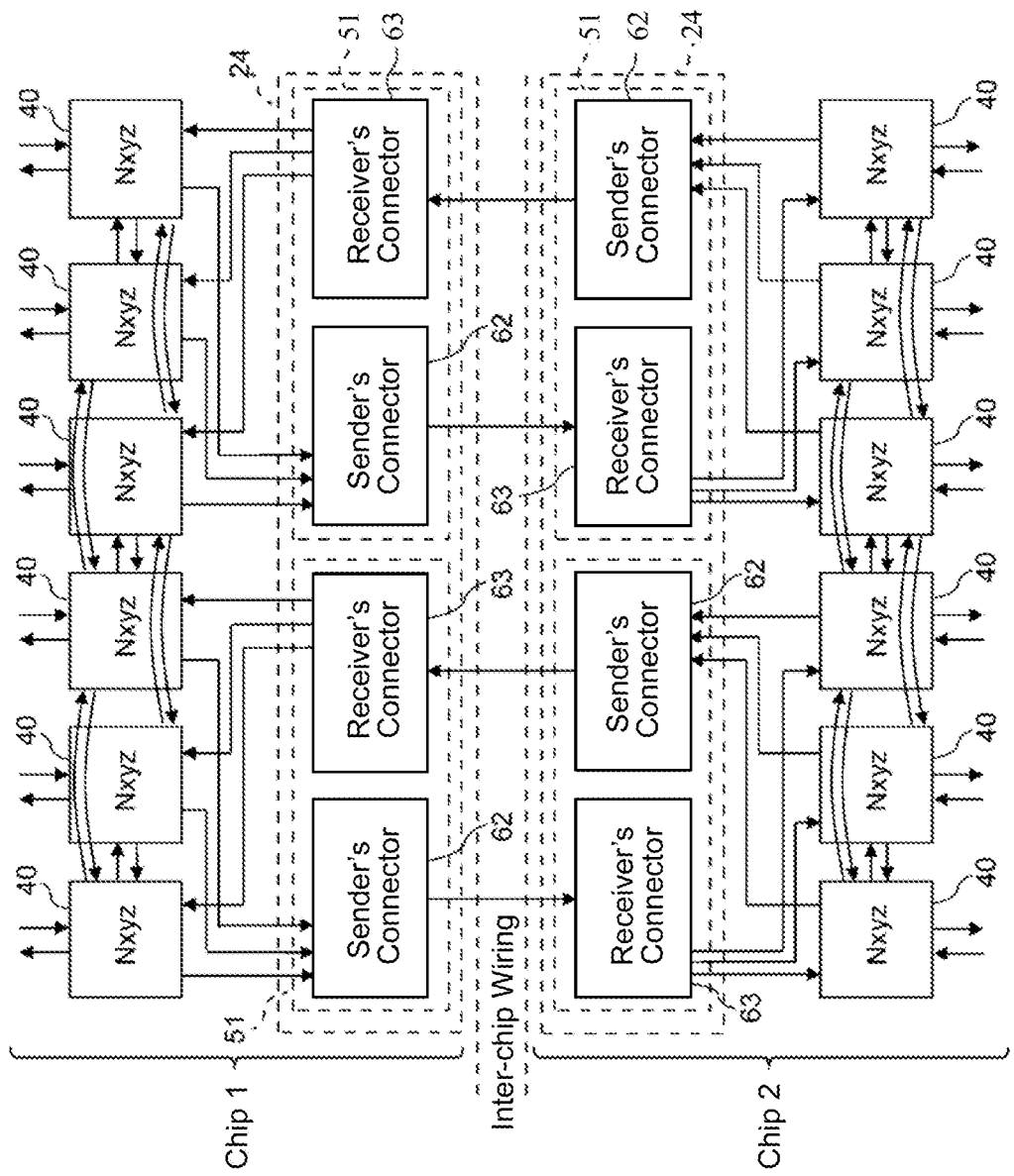
FIG. 14 is a block diagram for explaining a method for sharing the inter-chip wire between the Ising chips by means of time sharing.

On the other hand, FIG. 14 shows a configuration example of a case where the connection units 50 and the inter-chip wire 14 are formed so that the inter-chip wire 14 is shared by means of time sharing.

In this example of FIG. 14, one connection unit 51 is formed for a specified number (three in FIG. 4) of spin units 40 provided at the chip end of the Ising chip 13. This connection unit 51 is composed of: a sender connector 62 which is an interface for the relevant spin unit 40 to send spin values to the corresponding spin unit 40 in the other adjacent Ising chip 13; and a receiver connector 63 for the relevant spin unit 40 to receive the spin values sent from the corresponding spin unit 40 in the other adjacent Ising chip 13.

Then, the inter-chip wire 14 is provided between the Ising chips 13 to connect the sender connector 62 provided on one Ising chip 13 and the corresponding receiver connector 63 provided on the other Ising chip 13 and to connect the receiver connector 63 provided on the one Ising chip 13 and the sender connector 62 provided on the other Ising chip 13.

Figure 15:
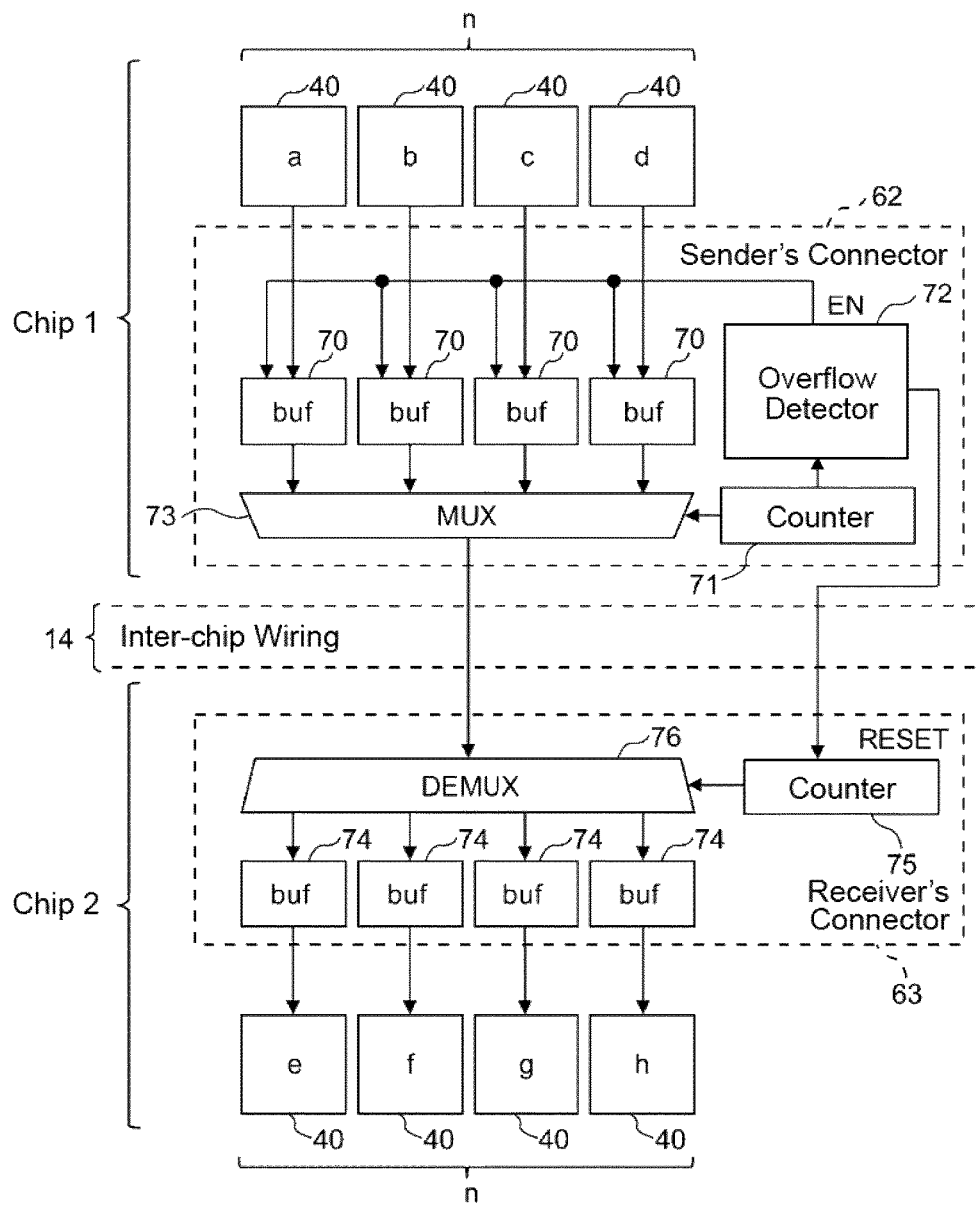
FIG. 15 is a block diagram showing a configuration example of a sender connector and a receiver connector according to the first embodiment.

FIG. 15 shows a specific configuration example of the sender connector 62 and the receiver connector 63 in FIG. 14. Incidentally, FIG. 14 shows an example in which the sender connector 62 and the receiver connector 63 are provided for each set of three spin units 40, while FIG. 15 shows an example in which the sender connector 62 and the receiver connector 63 are provided for each set of four spin units 40; however, this difference does not have any special meaning. For how many spin units 40 the sender connector 62 and the receiver connector 63 should be provided is not a problem.

Furthermore, FIG. 14 illustrates only the configuration of the sender connector 62 and the receiver connector 63 and the inter-chip wire 14 to send the spin values from the Ising chip 13 "Chip 1" to the Ising chip 13 "Chip 2" and the configuration of the sender connector 62 and the receiver connector 63 and the inter-chip wire 14 to send the spin values from the Ising chip 13 "Chip 2" to the Ising chip 13 "Chip 1" is omitted, but the latter configuration is the same as the former configuration.

The sender connector 62 is configured by including a plurality of buffer memories 70, which are provided and associated with their corresponding spin units 40, a counter 71, an overflow detector 72, and a multiplexer 73 as shown in FIG. 15.

The counter 71 is an N-ary counter that repeatedly counts consecutive numeric values starting from "0" in the same quantity as the number of the spin units 40 connected to the relevant sender connector 62 in synchronization with an I/O clock. For example, in the case of FIG. 15, one sender connector 62 is provided for four spin units 40, so that the counter 71 repeatedly counts four numeric values from "0" to "3." Then, the counter 71 sequentially reports the count value to the overflow detector 72 and the multiplexer 73.

Figure 16:
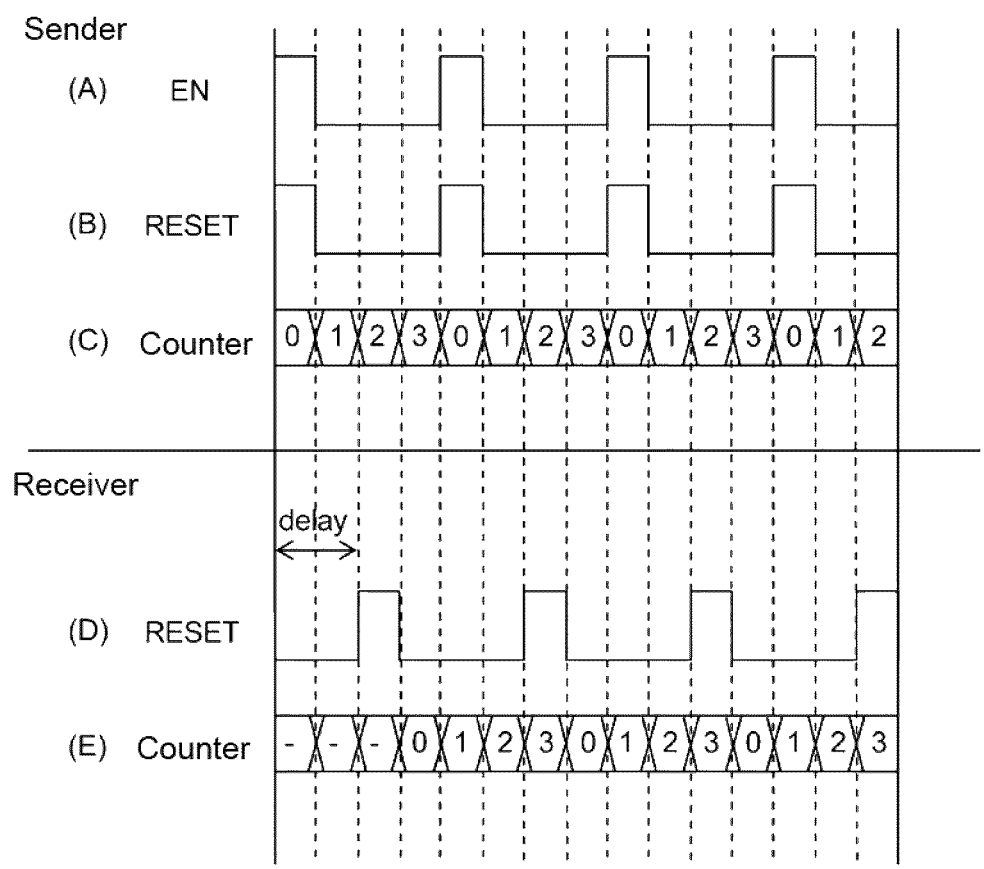
FIG. 16 is a timing chart for explaining operation of the sender connector and the receiver connector in FIG. 15.

The overflow detector 72 sends, for example, an enable signal EN as shown in FIG. 16(A), whose count value (FIG. 16(C)) reported from the counter 71 rises to a logical "1" level only during the period of "0," to each buffer memory 70. Furthermore, the overflow detector 72 generates a reset signal RESET as shown in FIG. 16(B), whose count value of the counter 71 rises to the logical "1" level only during the period of "0," and sends the generated reset signal RESET to the corresponding receiver connector 63 of the adjacent Ising chip 13.

Each buffer memory 70 is composed of a 1-bit memory cell. The buffer memory 70 fetches, stores, and retains the spin value retained by the corresponding spin unit 40 only during the time period when the enable signal EN supplied from the overflow detector 72 rises to the logical "1" level; and the buffer memory 70 then sends the stored and retained spin value to the multiplexer 73.

The multiplexer 73 sends the spin value, which has been sent out from the buffer memory 70 associated with the count value reported from the counter 71, selectively to the corresponding receiver connector 63 in the adjacent Ising chip 13 via the inter-chip wire 14 according to the count value reported from the counter 71.

In practice, the multiplexer 73 sends: a spin value, which has been sent from the buffer memory 70 corresponding to the spin unit 40 "a" in FIG. 15, via the inter-chip wire 14 to the corresponding receiver connector 63 in the adjacent Ising chip 13 during the period of the count value "0" reported from the counter 71; and a spin value, which has been sent from the buffer memory 70 corresponding to the spin unit 40 "b" in FIG. 15, via the inter-chip wire 14 to the corresponding receiver connector 63 in the adjacent Ising chip 13 during the period of the count value "1" reported from the counter 71. Furthermore, the multiplexer 73 sends: a spin value, which has been sent from the buffer memory 70 corresponding to the spin unit 40 "c" in FIG. 15, via the inter-chip wire 14 to the corresponding receiver connector 63 in the adjacent Ising chip 13 during the period of the count value "2" reported from the counter 71; and a spin value, which has been sent from the buffer memory 70 corresponding to the spin unit 40 "d" in FIG. 15, via the inter-chip wire 14 to the corresponding receiver connector 63 in the adjacent Ising chip 13 during the period of the count value "3" reported from the counter 71.

On the other hand, the receiver connector 63 is configured by including a plurality of buffer memories 74 provided and associated with the spin units connected to the receiver connector 63 itself, a counter 75, and a demultiplexer 76.

The counter 75 is an N-ary counter that repeatedly counts consecutive numeric values starting from "0" in the same quantity as the number of the spin units 40 connected to the relevant receiver connector 63 (that is, the same quantity as the number of the spin units 40 connected to the sender connector 62) in synchronization with the I/O clock. For example, in the case of FIG. 15, one receiver connector 63 is provided for four spin units 40, so that the counter 75 repeatedly counts four numeric values from "0" to "3."

In this case, a reset signal RESET as shown in FIG. 16(D), which has been sent out from the overflow detector 72 of the corresponding sender connector 62 of the adjacent Ising chip 13 as described above is supplied to the counter 75. Incidentally, FIG. 16(D) shows a delay of two clocks ("delay") generated in the transmission of the reset signal RESET between the Ising chips 13. Therefore, the counter 75 counts the numerical value so that the count value becomes "0" at the timing when the reset signal RESET (FIG. 16(D)) rises from the logical "1" level to the logical "0" level as shown in FIG. 16(E). Then, the counter 75 sequentially reports the count value at that time to the demultiplexer 76.

The demultiplexer 76 distributes the spin values, which have been sent via the inter-chip wire 14 from the corresponding sender connector 62 of the adjacent Ising chip 13, to the corresponding buffer memory 74 in synchronization with the count value reported from the counter 75.

In practice, referring to FIG. 15, the demultiplexer 76 distributes the received spin value to the corresponding buffer memory 74 of: the spin unit 40 "e" during the period of the count value "0" reported from the counter 75; and the spin unit 40 "f" during the period of the count value "1" reported from the counter 75. Furthermore, the demultiplexer 76 distributes the received spin value to the corresponding buffer memory 74 of: the spin unit 40 "g" during the period of the count value "2" reported from the counter 75; and the spin unit 40 "h" during the period of the count value "3" reported from the counter 75.

Each buffer memory 74 is composed of a 1-bit memory cell, stores and retains the spin value distributed from the demultiplexer 76, and sends the stored and retained spin value to the corresponding spin unit 40.

Figure 17:
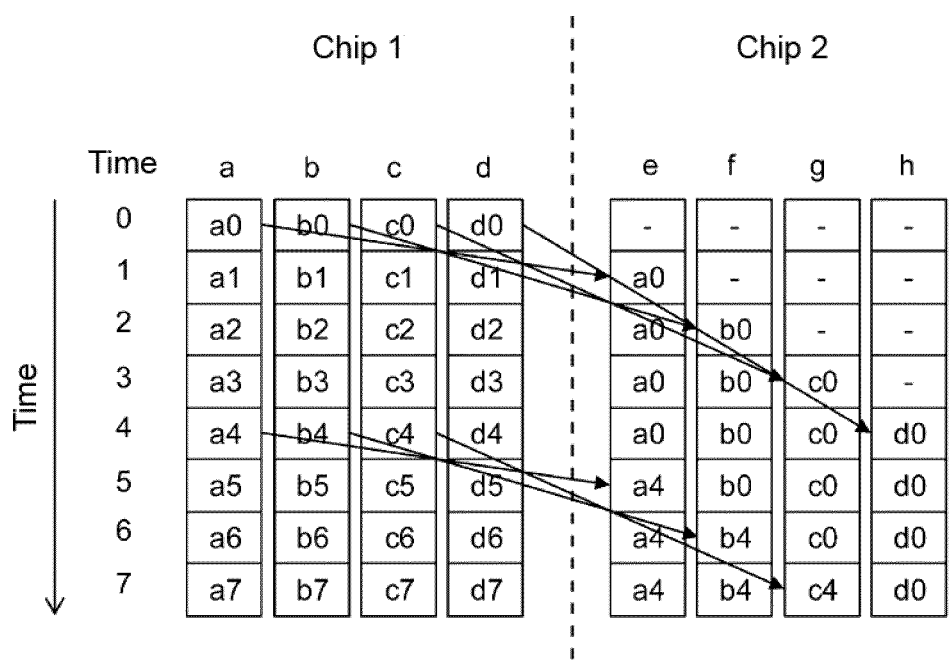
FIG. 17 is a conceptual diagram illustrating how spin values are transmitted between spin units in FIG. 15.

With this arrangement above, in case the number of the spin units 40 connected to the sender connector 62 is n, the spin values, which have been sent from the respective corresponding spin units 40 (the respective spin units 40 "a" to "d" of "Chip 1") in the Ising chip 13 at the same timing, are transmitted to the respective corresponding spin units 40 (the respective spin units 40 "e" to "h" of "Chip 2") in the Ising chip 13 by thinning the spin values to 1/n on a time scale as shown in FIG. 17.

If such a configuration is used, each spin unit 40 provided at the chip end of the Ising chip can obtain only some spin values, which have been thinned on the time scale, from the corresponding spin units 40 in the adjacent Ising chip. However, even in this case, since the spin values are originally often inverted at the beginning of the interaction processing, thinning of the spin values on the time scale would not significantly influence the inversion of the spins; and at the latter half of the interaction processing, the spins do not invert so much, so that the inversion of other spins will not be influenced so much. Therefore, even by doing so, the precision of the ground-state search of the spin units 40 will not be reduced significantly. On the contrary, the wiring amount of the inter-chip wire 14 connecting the Ising chips 13 can be reduced to 1/n by doing so.

Figure 18:
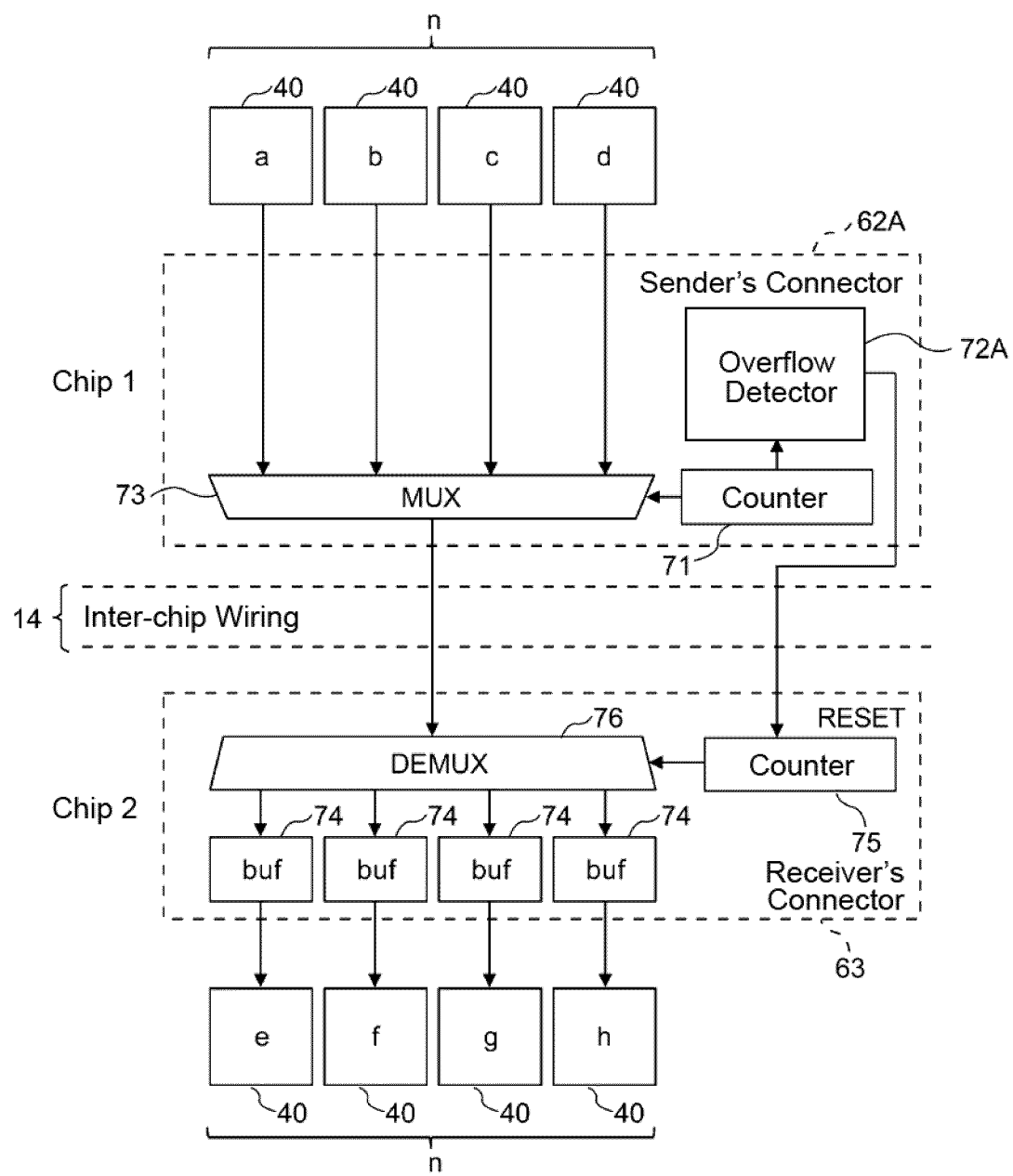
FIG. 18 is a block diagram showing another configuration example of the sender connector and the receiver connector.

FIG. 18 in which parts corresponding to those in FIG. 15 are assigned the same reference numerals as those in FIG. 15 shows another configuration example of the sender connector 62 of the connection unit 51 (FIG. 11). The difference between the sender connector 62A shown in FIG. 18 and the sender connector 62 described above with reference to FIG. 15 is not that the sender connector 62A is not provided with buffer memories respectively associated with the spin units 40 connected to the relevant sender connector 62A and output from each spin unit 40 is directly input to the multiplexer 73 and accordingly, the overflow detector 72A does not generate the enable signal, but generates only the reset signal RESET and sends it to the corresponding receiver connector 63 in the adjacent Ising chip 13.

Incidentally, FIG. 18 illustrates only the configuration of the sender connector 62A and the receiver connector 63 and the inter-chip wire 14 to send the spin values from the Ising chip 13 "Chip 1" to the Ising chip 13 "Chip 2" and the configuration of the sender connector 62A and the receiver connector 63 and the inter-chip wire 14 to send the spin values from the Ising chip 13 "Chip 2" to the Ising chip 13 "Chip 1" is omitted, but the latter configuration is the same as the former configuration.

Figure 19:
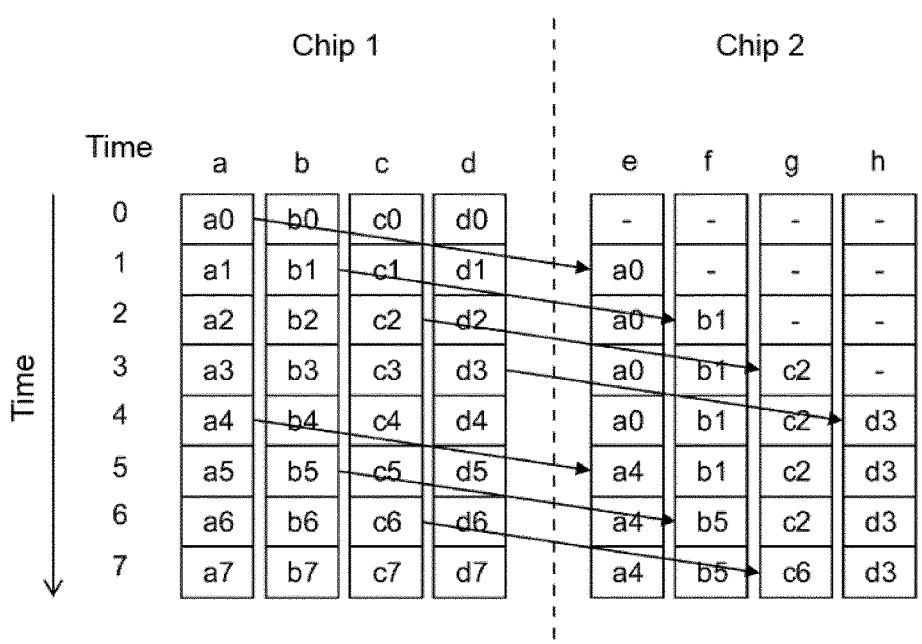
FIG. 19 is a conceptual diagram showing how spin values are transmitted between spin units in FIG. 18.

FIG. 19 shows how the spin values are transmitted between the sender connector 62A and the receiver connector 63 having the configuration described above. As is apparent from this FIG. 19, regarding between the sender connector 62A and the receiver connector 63 as shown in FIG. 19 when, the number of the spin units 40 connected to the sender connector 62A is n, spin values which are output from the respective corresponding spin units 40 (respective spin units 40 "a" to "d" of "Chip 1") in the sender Ising chip 13 at different timings (different docks), are transmitted to the respective corresponding spin units 40 (respective spin units 40 "e" to "h" of "Chip 2") in the receiver Ising chip 13 by thinning the spin values to 1/n on the time scale.

If this configuration is used, it is possible to reduce the wiring amount of the inter-chip wire 14 connecting the Ising chips 13 to 1/n without significantly reducing the precision of the ground-state search at the spin units 40 in the same manner as in the case described with reference to FIG. 15.

(1-4) Multi-Ising Chip Control Procedures

Figure 20:
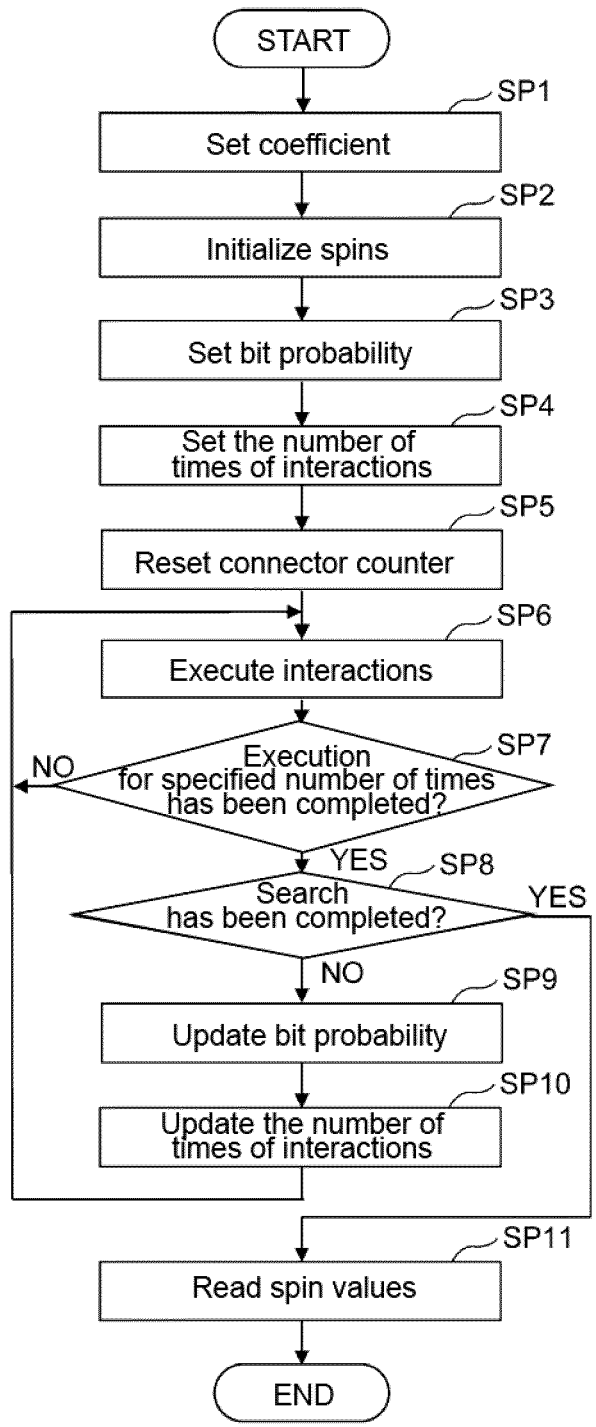
FIG. 20 is a flowchart illustrating a processing sequence for ground-state search processing.
Figure 21:
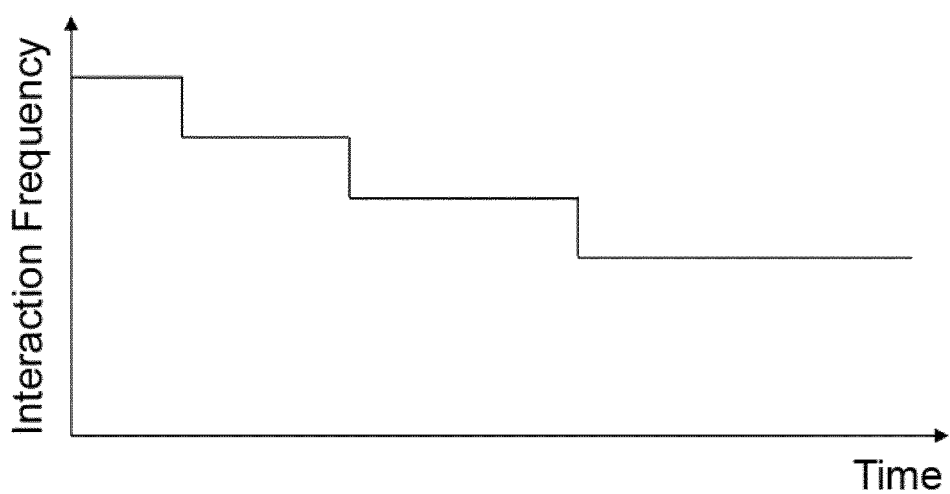
FIG. 21 is a conceptual diagram for explaining another processing sequence for the ground-state search processing.

FIG. 20 illustrates a processing sequence for the ground-state search processing executed by the CPU 3 (FIG. 1) for this information processing unit 1. The CPU 3 executes the ground-state search on these Ising chips 13 by controlling the Ising chips 13 in a necessary multi-Ising chip 6 (FIG. 2) via the controller 15 (FIG. 2) for that multi-Ising chip 6 based on the multi-Ising chip control program 9 (FIG. 1) in accordance with the processing sequence shown in this FIG. 21.

Incidentally, the CPU 3 controls the Ising chips 13 in each multi-Ising chip 6 and the spin units 40 in the Ising chip 13 via the controller 15 (FIG. 2) in the multi-Ising chip 6; and the following explanation will be given by ignoring the existence of the controller 15 as necessary in order to facilitate understanding.

After starting this ground-state search processing in response to, for example, a user's instruction, the CPU 3 firstly converts the problem data 7 (FIG. 1) into an Ising model according to the problem conversion program 8 (FIG. 1), divides the Ising model, which is obtained by the conversion, into partial problems for each multi-Ising chip (partial Ising model), and sends an instruction to the controller 15 for the corresponding multi-Ising chip 6 to set the interaction coefficients and external magnetic field coefficients of the relevant partial problem to each spin unit 40 in each Ising chip 13 (SP1). Consequently, the controller 15 for the multi-Ising chip 6 which has received this instruction further divides this partial problem into partial problems for each Ising chip 13 and set the interaction coefficients and the external magnetic field coefficients of these partial problems to their corresponding Ising chips 6, respectively.

Subsequently, the CPU 3 determines the spin value, which should be retained by each spin unit, according to the random number and initializes the spin value of each spin unit 40 in each Ising chip 13 at the multi-Ising chip 6 so that the spin value becomes the determined spin value (SP2).

Next, the CPU 3 sets probability at which the random number "1" is generated by the random number generator 17 (FIG. 2) in each predetermined multi-Ising chip 6 (hereinafter referred to as the mark ratio) (SP3). In the case of this embodiment, the mark ratio of the random number generated by the random number generator 17 is set high at the beginning and the mark ratio is then made to decrease in a stepwise manner the mark ratio. As a result, the spin value retained by each spin unit 40 can be easily inverted at the beginning and then it gradually becomes difficult to invert that spin value (it can easily converge to "0" or "1"). Therefore, in step SP3, the mark ratio at each of the above-mentioned steps is set.

Furthermore, the CPU 3 sets the number of times of execution of the interaction operations for each predetermined mark ratio (SP4). Next, in order to match the timing between the Ising chips 13, the CPU 3 resets the counter in each the connection unit 50 (FIG. 11) of each Ising chip 13 (the counter 71 (FIG. 15, FIG. 18) of the sender connector 62, 62A and the counter 75 (FIG. 15, FIG. 18) of the receiver connector 63) (that is, sets the count value to "0") (SP5).

Subsequently, the CPU 3 executes the interaction operation once at each spin unit in each Ising chip 13 by, for example, driving the interaction clock generator 16 (FIG. 2) of the multi-Ising chip 6 (SP6); and then judges whether or not the execution of the interaction operation has been completed as many times as set for the current mark ratio (SP7). Then, if the CPU 3 obtains a negative result in this judgment, the CPU 3 returns to step SP6 and then repeats the processing in step SP6 and step SP7.

Then, if the CPU 3 eventually obtains an affirmative result in step SP7 by executing the interaction operation as many times as set for the currently set mark ratio, the CPU 3 judges whether the execution of all the execution operations for each mark ratio set in step SP4 have been completed or not (SP8).

If the CPU 3 obtains a negative result in this judgment, the CPU 3 updates the mark ratio to a predetermined mark ratio lower than the current mark ratio (SP9) and then updates the number of times of the interaction operation to be executed to a predetermined number of times (SP10). Subsequently, the CPU 3 returns to step SP6 and then repeats the processing from step SP8 to step SP10.

Then, if the CPU 3 eventually obtains an affirmative result in step SP8 by completing the execution of all the interaction operations for each mark ratio set in step SP4, the CPU 3 reads the spin value retained by each spin unit 40 in each Ising chip 13 of the then-targeted multi-Ising chip 6 (SP11) and then terminates this ground-state search processing.

Incidentally, with the information processing unit 1 according to this embodiment, the delay time in the inter-chip wire 14 (FIG. 11) which connects the corresponding Ising chips 13 in each multi-Ising chip 6 is constant. Therefore, if frequency of the aforementioned interaction clocks supplied to each Ising chip 13 (hereinafter referred to as the interaction frequency) is set low, the number of delay clocks of the interaction clocks between the Ising chip 13 seems small; and on the other hand, if the interaction frequency is set high, the number of delay clocks of the interaction clocks between the Ising chip 13 seems large.

In this case, immediately after the start of the ground-state search, the spin value of each spin unit 40 inverts randomly at high probability. So, even if the spin value reaches the other Ising chip 13 late, it will not influence the ground-state search so much. Therefore, under such circumstances, each spin unit 40 can be operated at a high interaction frequency.

On the other hand, as the end, of the ground-state search approaches, it becomes difficult to invert the spin value of each spin unit 40. So, a more accurate value is required as an adjacent spin value when executing the interaction. Therefore, under such circumstances, the interaction frequency should preferably be gradually decreased in a stepwise manner in order to reduce apparent delay. Furthermore, if the interaction frequency is decreased, it becomes more difficult to invert the spins. Thus, the lower the interaction frequency is, the longer the time period for maintaining a constant interaction frequency should preferably be.

Figure 22:
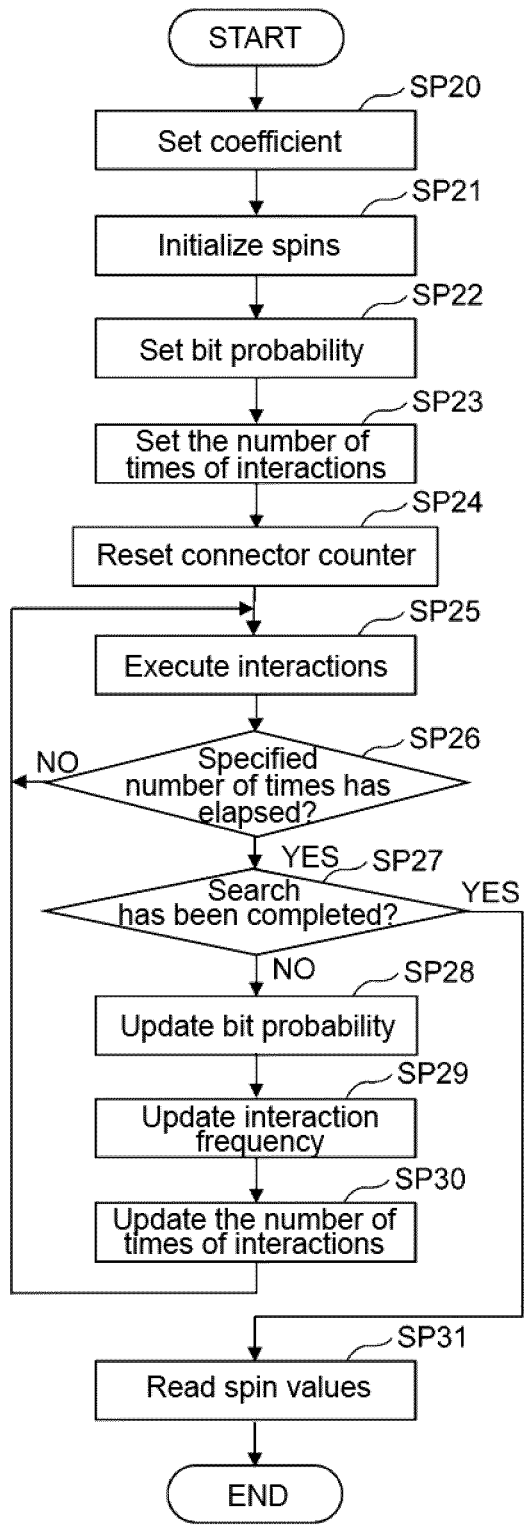
FIG. 22 is a flowchart illustrating another processing sequence for the ground-state search processing.

FIG. 22 illustrates a processing sequence for the ground-state search processing including control of such mutual frequency. In this case, the CPU 3 executes the processing from step SP20 to step SP28 in the same manner as from step SP1 to step SP28 of the ground-state search processing described earlier with reference to FIG. 20.

Subsequently, the CPU 3 controls the interaction clock generator 16 (FIG. 2) in each multi-Ising chip 6 to decrease the frequency of the interaction clocks generated by the interaction clock generator 16 (FIG. 2) in the multi-Ising chip 6 by a specified preset frequency (SP29).

Subsequently, the CPU 3 executes the processing from step SP30 to step SP31 in the same manner as from step SP10 to step SP11 of the ground-state search processing described earlier with reference to FIG. 20 and then terminates this ground-state search processing.

(1-5) Advantageous Effects of this Embodiment

The information processing unit 1 according to this embodiment as described above sends and receives only some necessary spin values between the Ising chips 13 in the multi-Ising chip 6 or shares the inter-chip wire 14 by means of time sharing (sends and receives the spin values, which are retained by each of a plurality of the corresponding spin units 40, via the inter-chip wire 14 by shifting the timing for each spin unit 40). Accordingly, the wiring amount of the inter-chip wire 14 connecting the Ising chips 13 can be reduced. Therefore, it is possible to implement the multi-Ising chip 6 that can search the ground state of a large-scale Ising model and be manufactured easily at inexpensive cost.

(2) Second Embodiment

Figure 23:
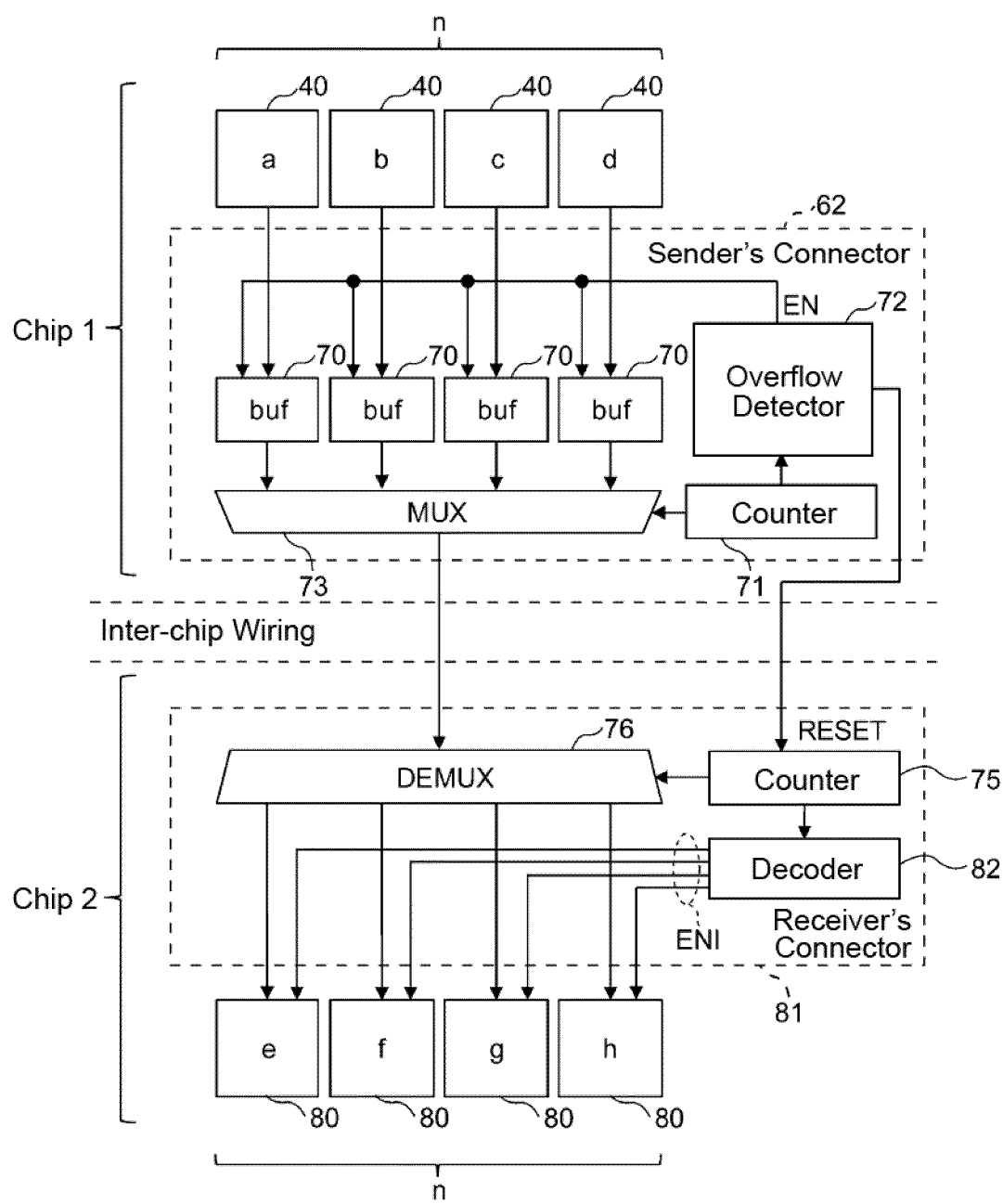
FIG. 23 is a block diagram showing a configuration example for a sender connector and a receiver connector according to the second embodiment.

FIG. 23 in which parts corresponding to those in FIG. 15 are assigned the same reference numerals as those in FIG. 15 shows the configuration of a receiver connector 81 which is applied to the information processing unit 1 in FIG. 1 instead of the receiver connector 63 according to the first embodiment described above with reference to FIG. 15. This embodiment is characterized in that the receiver connector 81 is not provided with a buffer memory.

In practice, in the case of this embodiment, the receiver connector 81 is not provided with a buffer memory associated with each spin unit 80 connected with the receiver connector 81, so that output from the demultiplexer 76 is directly input to each of the corresponding spin units 80 and a decoder 82 is provided accordingly.

In this case, the decoder 82 is notified of a count value of the counter 75. Then, the decoder 82 supplies an enable signal EN1, which rises only during that count value, to the spin unit 80 associated with the relevant count value based on the reported count value of the counter 75.

Specifically speaking, referring to FIG. 23, the decoder 82 supplies: the enable signal EN1, which rises only during a period of the count value "0" reported from the counter 75, to the spin unit 80 "e"; and the enable signal EN1, which rises only during a period of the count value "1" reported from the counter 75, to the spin unit 80 "f". Furthermore, the decoder 82 supplies: the enable signal EN1, which rises only during a period of the count value "2" reported from the counter 75, to the spin unit 80 "g"; and the enable signal EN1, which rises only during a period of the count value "3" reported from the counter 75, to the spin unit 80 "h."

Figure 24:
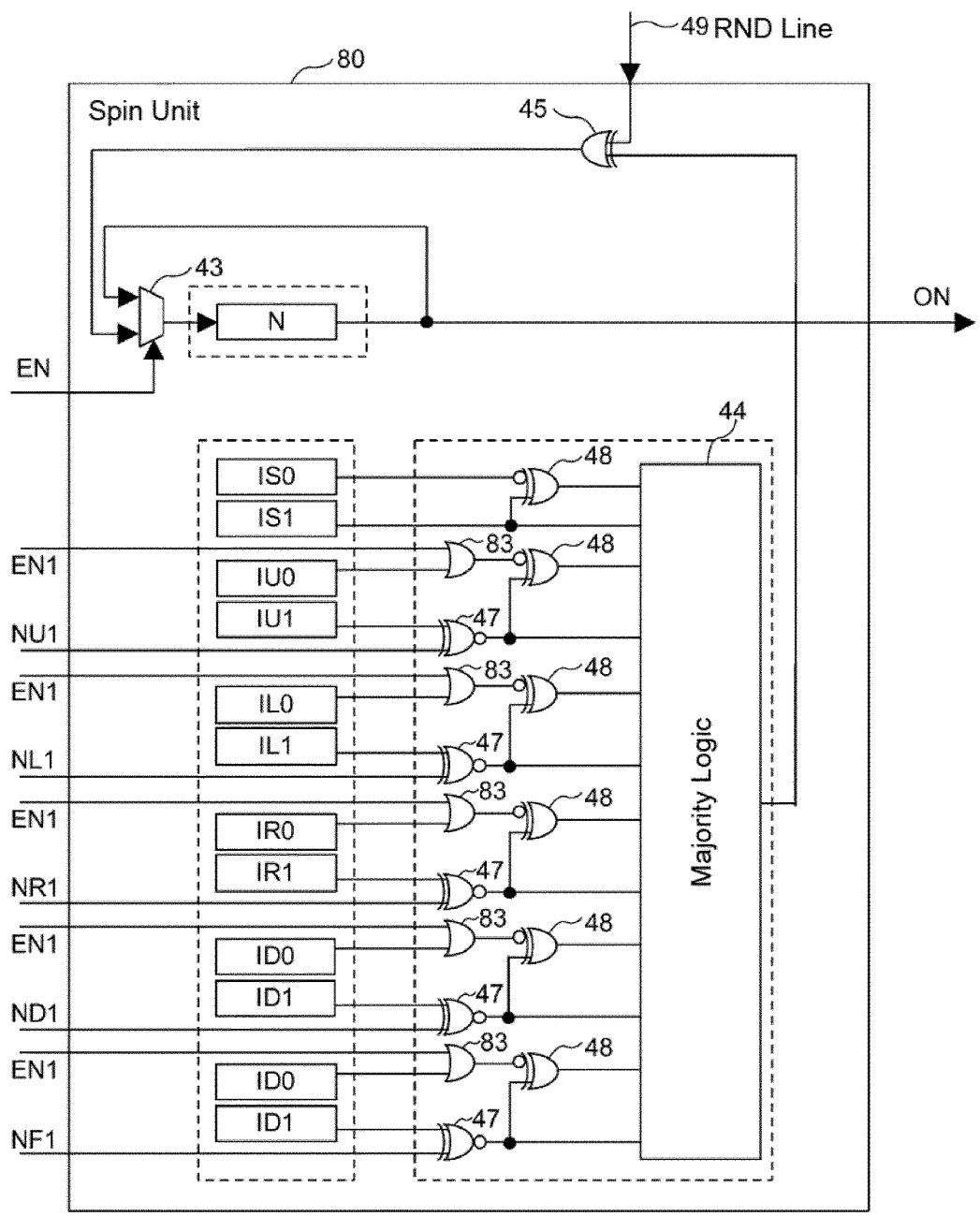
FIG. 24 is a block diagram showing a configuration example of a spin unit according to the second embodiment.

On the other hand, FIG. 24 in which parts corresponding to those in FIG. 7 are assigned the same reference numerals as those in FIG. 7 shows the configuration of the spin unit 80 according to this embodiment which is connected to the receiver connector 81. With this spin unit 80, the OR circuit 83 calculates a logical sum (OR) of the enable signal EN1 supplied from the decoder 82 of the receiver connector 81 and values retained by each memory cell IU0, IL0, IR0, ID0, IF0; and the XOR circuit 48 calculates an exclusive OR (XOR) of the logical sum calculated by the XOR circuit 48 and the output from the XNOR circuit 47. As a result, only when the enable signal EN1 is 0, the output from the demultiplexer 76 is fetched by the spin unit 80 and that spin unit 80 calculates the spin value.

Figure 25:
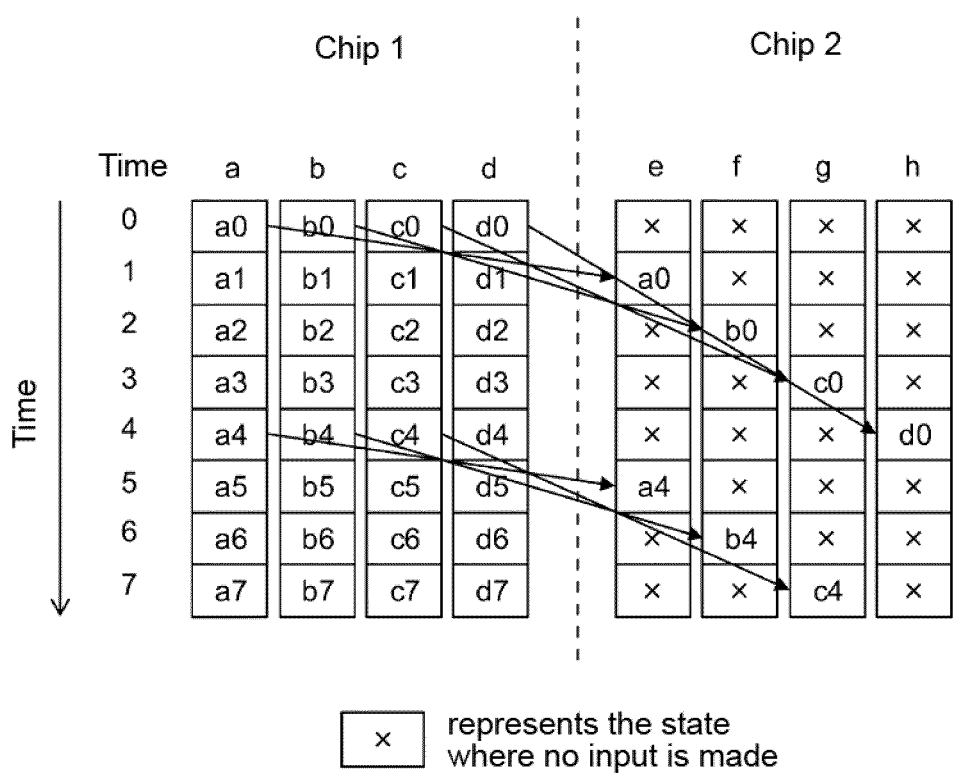
FIG. 25 is a conceptual diagram showing how spin values are transmitted between spin units in FIG. 23.

FIG. 25 shows how the spin values are transmitted between the Ising chips 13 when the sender connector 62 and the receiver connector 81 in FIG. 23 are applied to the multi-Ising chip 6. As is apparent from this FIG. 25, regarding the Ising chips 13 in the case of this embodiment, when the number of the spin units 40 connected to the sender connector 62A is n, spin values which are output from the respective corresponding spin units 40 (respective spin units 40 "a" to "d" of "Chip 1") in the sender Ising chip 13 at the same timing (the same clock), are transmitted to the respective corresponding spin units 80 (respective spin units 80 "e" to "h" of "Chip 2") in the receiver Ising chip 13 by thinning the spin values to 1/n on a time scale. In this case, the spin units 80 connected to the receiver connector 81 do not receive any input from the receiver connector 81 except during the time period when the relevant spin units 80 fetch the spin values.

If such a configuration is used, the wiring amount of the inter-chip wire 14 connecting the adjacent Ising chips 13 can be reduced to 1/n without significantly reducing the precision of the ground-state search of the spin units 40, 80 in the same manner as in the first embodiment.

Incidentally, FIG. 23 illustrates only the configuration of the sender connector 62A and the receiver connector 63 and the inter-chip wire 14 to send the spin values from the Ising chip 13 "Chip 1" to the Ising chip 13 "Chip 2" and the configuration of the sender connector 62A and the receiver connector 63 and the inter-chip wire 14 to send the spin values from the Ising chip 13 "Chip 2" to the Ising chip 13 "Chip 1" is omitted, but the latter configuration is the same as the former configuration.

Figure 26:
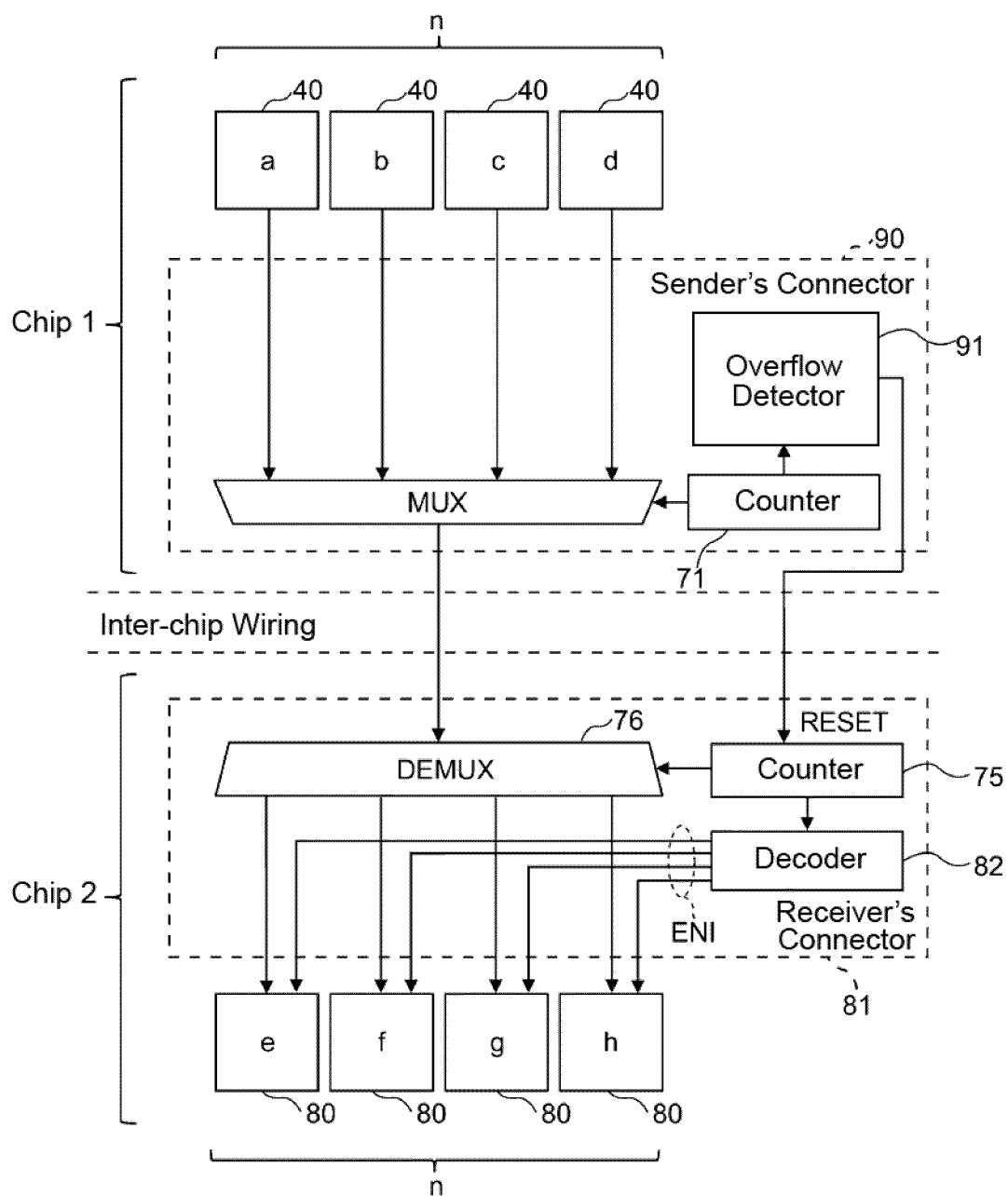
FIG. 26 is a block diagram showing another configuration example of a sender connector and a receiver connector according to the second embodiment.

On the other hand, FIG. 26 in which parts corresponding to those in FIG. 23 are assigned the same reference numerals as those in FIG. 23 shows another configuration example of the sender connector 62 in FIG. 23. The difference between the configuration of a sender connector 90 in. FIG. 26 and the configuration of the sender connector 62 described earlier with reference to FIG. 23 is that: the sender connector 90 is not provided with a buffer memory associated with the respective spin units 40 connected to the sender connector 90 and outputs from the respective spin units 40 are directly input to the multiplexer 73; and the overflow detector 91 does not thereby generate the enable signal, but generates only the reset signal RESET and sends it to the receiver's corresponding connector 81 in the adjacent.

Incidentally, FIG. 26 illustrates only the configuration of the sender connector 90 and the receiver connector 81 and the inter-chip wire 14 to send the spin values from the Ising chip 13 "Chip 1" to the Ising chip 13 "Chip 2" and the configuration of the sender connector 90 and the receiver connector 81 and the inter-chip wire 14 to send the spin values from the Ising chip 13 "Chip 2" to the Ising chip 13 "Chip 1" is omitted, but the latter configuration is the same as the former configuration.

Figure 27:
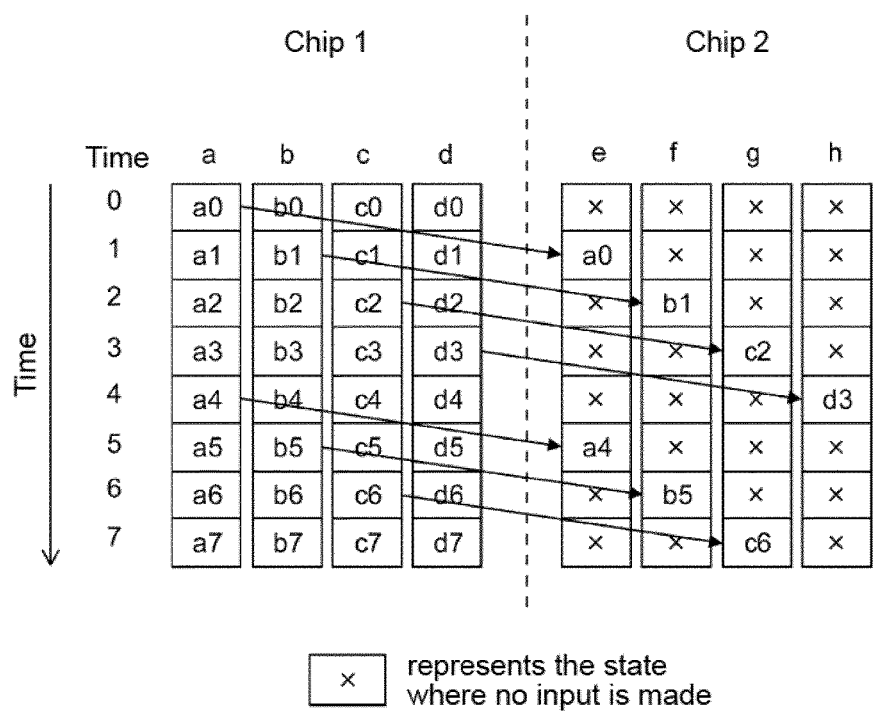
FIG. 27 is a conceptual diagram showing how spin values are transmitted between spin units in FIG. 26.

FIG. 27 shows how the spin values are transmitted between the sender connector 90 and the receiver connector 81 having the configuration described above. As is apparent from this FIG. 27, regarding between the sender connector 90 and the receiver connector 81 as shown in FIG. 26, when the number of the spin units 80 connected to the sender connector 62 is n, spin values which are output from the respective corresponding spin units 40 (respective spin units 40 "a" to "d" of "Chip 1") in the sender Ising chip 13 at different timings (different clocks), are transmitted to the respective corresponding spin units 80 (respective spin units 80 "e" to "h" of "Chip 2") in the receiver Ising chip 13 by thinning the spin values to 1/n on a time scale.

If this configuration is used, it is possible to reduce the wiring amount of the inter-chip wire 14 connecting the Ising chips 13 to 1/n without significantly reducing the precision of the ground-state search at the spin units 40, 80 in the same manner as in the case described with reference to FIG. 23.

According to this embodiment as described above, the wiring amount of the inter-chip wire 14 connecting the Ising chips 13 can be reduced in the same manner as in the first embodiment. Therefore, it is possible to implement the multi-Ising chip 6 that can search the ground state of a large-scale Ising model and be manufactured easily at inexpensive cost.

(3) Other Embodiments

It should be noted that the aforementioned first and second embodiments have described the case where the present invention is applied to the multi-Ising chip 6 which simulates interactions between spins in the Ising model; however, the present invention is not limited to this example and can be applied to a wide variety of semiconductor devices which simulate interactions between nodes in interaction models other than the Ising model. Such a semiconductor device can be configured in the same manner as the multi-Ising chips 6 according to the first and second embodiments described above with reference to FIG. 1 to FIG. 27. In this case, if there is no bias for each node, a memory cell pair ISx which retains a coefficient of that bias (hereinafter referred to as the bias coefficient) can be omitted from element units; and if such a bias exists, such a bias coefficient, instead of the external magnetic field coefficient, may be retained in the memory cell pair ISx.

Figure 2:
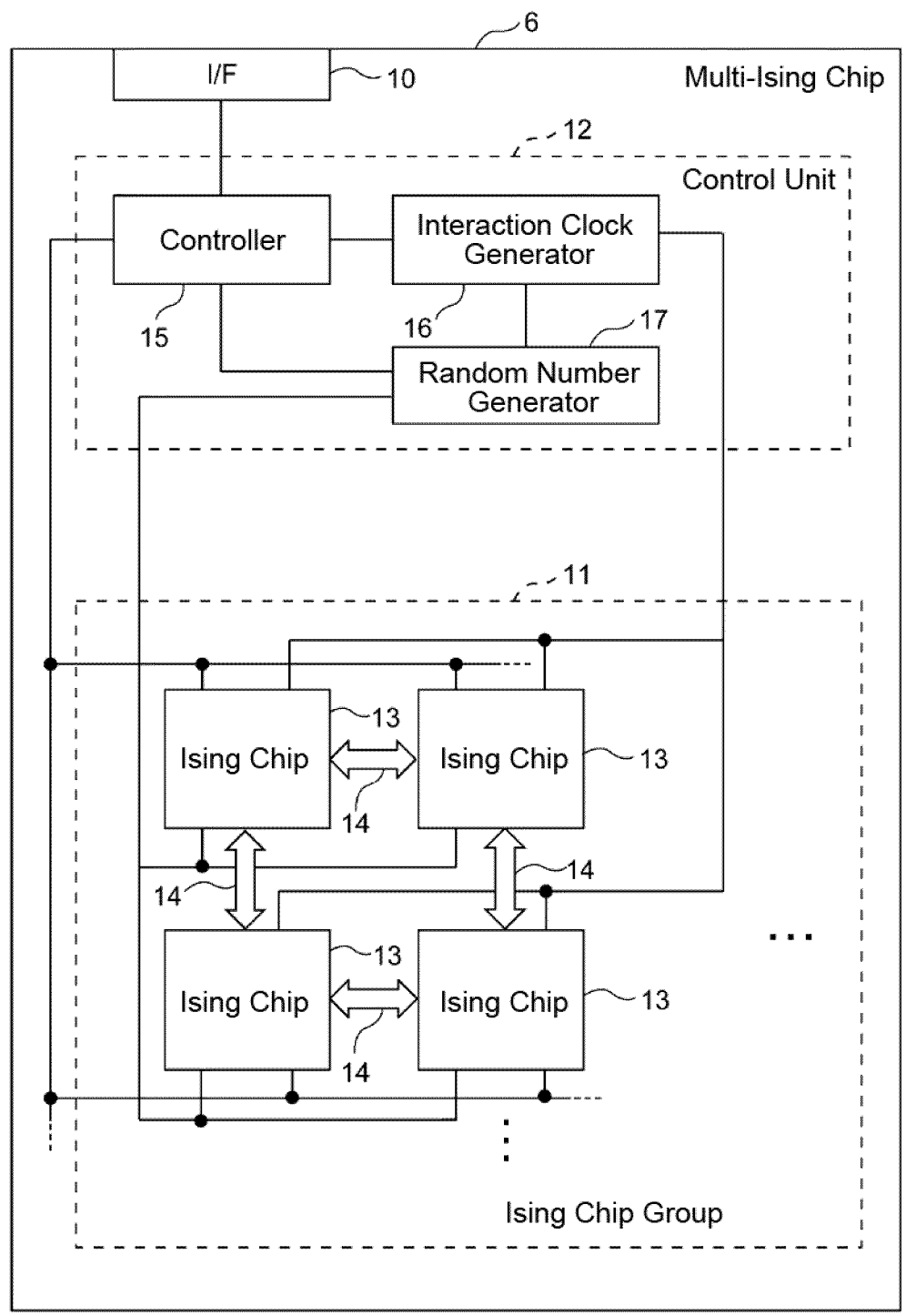
FIG. 2 is a block diagram showing the configuration of a multi-Ising chip.

Furthermore, the aforementioned first and the second embodiment have described the case where the multi-Ising chip 6 is constructed as shown in FIG. 2 and the Ising chip 13 is constructed as shown in FIG. 3, and the spin unit 40 is constructed as shown in FIG. 7 (or FIG. 24) and FIG. 8; however, the present invention is not limited to this example and other wide variety of configurations can be applied as the configurations of the multi-Ising chip 6, the Ising chip 13, and the spin unit 40.

Similarly, the aforementioned first and second embodiments have described the case where the sender connector 60, 62, 62A, 90 and the receiver connector 61, 63, 81 are constructed as shown in FIG. 15, FIG. 18, FIG. 23, or FIG. 26; however, the present invention is not limited to this example and other wide variety of configurations can be applied as the configurations of the sender connector 60, 62, 62A, 90 and the receiver connector 61, 63, 81.

INDUSTRIAL AVAILABILITY

The present invention can be applied to a wide variety of semiconductor devices that simulate interactions between nodes of interaction models.

REFERENCE SIGNS LIST 1 information processing unit; 3 CPU; 6 multi-Ising chip; 13 Ising chip; 14 inter-chip wire; 20 spin array; 24 inter-chip connector; 40, 80 spin unit; 60, 62, 62A, 90 sender connector; 61, 63, 81 receiver connector; 70, 74 buffer memory; 71, 75 counter; 72, 72A, 91 overflow detector; 73 multiplexer; 76 demultiplexer; and 82 decoder.

What is claimed is:

1. A semiconductor device comprising:
a plurality of semiconductor chips, each of which simulates an interaction between nodes of an interaction model; and
an inter-chip wire connecting the semiconductor chips,
wherein the plurality of semiconductor chips are used to simulate an interaction between nodes of a single interaction model;
wherein each of the semiconductor chips includes:
a plurality of element units, each of which retains values indicating a state of corresponding nodes and interaction coefficients between other nodes causing an interaction over the nodes and determines values indicating a next state of the corresponding nodes, based on the retained values indicating the state of the nodes and each of the interaction coefficients and values indicating a state of each of other nodes causing interactions over the corresponding nodes; and
a connection unit that sends and receives part of the values indicating the state of the nodes, which are retained by a necessary element unit, via the inter-chip wire to and from another semiconductor chip or sends and receives the values indicating state of the nodes, which are retained by the necessary element unit, to and from the other semiconductor chip via the inter-chip wire while sharing the inter-chip wire by means of time sharing,
wherein the connection unit is associated with a specified number of the element units among the element units, which retain the values indicating the state of the nodes required within a present semiconductor chip, and sends and receives the values indicating the state of the nodes, which are retained by each of the associated number of element units, and the values indicating the state of the nodes, which are retained by a corresponding element unit in a corresponding other semiconductor chip, to and from the other semiconductor chip via the inter-chip wire by shifting timing for each of the element units,
wherein the specified number of element units are N element units; and
wherein the connection unit includes N−1 pieces of wiring.

2. The semiconductor device according to claim 1, wherein the specified number of element units are N element units; and
wherein the connection unit includes N−1 pieces of wiring.

3. The semiconductor device according to claim 1, wherein the sender connector includes:
a first buffer memory associated with each of the element units associated with the connection unit comprised of a sender connector in the present semiconductor chip and stores and retains the values indicating the state of the nodes which are retained by corresponding element units;
a first counter that counts consecutive numerical values of a same quantity as the number of the element units associated with the connection unit; and
a multiplexer that sends the values indicating the state of the nodes, which are stored and retained in the first buffer memory associated with a count value of the first counter, to the corresponding other semiconductor chip via the inter-chip wire according to the count value of the first counter; and wherein the receiver connector includes:
    a second counter that counts consecutive numerical values of a same quantity as the number of the element units associated with the connection unit;
    a demultiplexer that distributes each of the values indicating the state of each of the nodes, which is sent from the corresponding other semiconductor chip via the inter-chip wire, to the element unit associated with a count value of the second counter according to the count value of the second counter; and
    a second buffer memory that is provided between each element unit in the present semiconductor chip associated with the connection unit and the demultiplexer, stores and retains the values indicating the state of the nodes distributed by the demultiplexer to the corresponding element unit, and gives the stored and retained values indicating the state of the nodes to the corresponding element unit.

4. The semiconductor device according to claim 3, further comprising a controller that controls operation of each of the semiconductor chips,
    wherein the controller initially resets each of the first and second counters in each of the semiconductor chips.

5. The semiconductor device according to claim 1, wherein the connection unit includes:
    a sender connector through which each associated element unit in the present semiconductor chip sends the retained values indicating the state of the nodes to the other semiconductor chip via the inter-chip wire; and
    a receiver connector which distributes the values indicating the state of the nodes retained by each corresponding element unit in the other semiconductor chip, to which the values indicating the state of the nodes are sent from the other semiconductor chip via the inter-chip wire, to the corresponding element unit in the present semiconductor chip.

6. The semiconductor device according to claim 5, wherein the sender connector includes:
    a buffer memory associated with each of the element units associated with the connection unit composed of the sender connector in the present semiconductor chip and stores and retains the values indicating the state of the nodes which are retained by the corresponding element units;
    a first counter that counts consecutive numerical values of the same quantity as the number of the element units associated with the connection unit; and
    a multiplexer that sends the values indicating the state of the nodes, which are stored and retained in the buffer memory associated with a count value of the first counter, to the corresponding other semiconductor chip via the inter-chip wire according to the count value of the first counter; and
    wherein the receiver connector includes:
    a second counter that counts consecutive numerical values of a same quantity as the number of the element units associated with the connection unit; and
    a demultiplexer that distributes the values indicating the state of each of the nodes, which is sent from the corresponding other semiconductor chip via the inter-chip wire, to the element unit associated with a count value of the second counter according to the count value of the second counter.

7. The semiconductor device according to claim 6, further comprising a controller that controls operation of each of the semiconductor chips,
    wherein the controller initially resets each of the first and second counters in each of the semiconductor chips.

8. The semiconductor device according to claim 5, wherein the sender connector includes:
    a first counter that counts consecutive numerical values of a same quantity as the number of the element units associated with the connection unit; and
    a multiplexer that sends the values indicating the state of the nodes, which are retained in the element unit associated with a count value of the first counter, to the corresponding other semiconductor chip via the inter-chip wire according to the count value of the first counter; and
    wherein the receiver connector includes:
    a second counter that counts consecutive numerical values of the same quantity as the number of the element units associated with the connection unit;
    a demultiplexer that distributes the values indicating the state of each of the nodes, which is sent from the corresponding other semiconductor chip via the inter-chip wire, to the element unit associated with a count value of the second counter according to the count value of the second counter; and
    a second buffer memory that is provided between each element unit in the present semiconductor chip associated with the connection unit and the demultiplexer, stores and retains the values indicating the state of the nodes distributed by the demultiplexer to the corresponding element unit, and gives the stored and retained values indicating the state of the nodes to a corresponding element unit.

9. The semiconductor device according to claim 8, further comprising a controller that controls operation of each of the semiconductor chips,
    wherein the controller initially resets each of the first and second counters in each of the semiconductor chips.

10. The semiconductor device according to claim 5, wherein the sender connector includes:
    a first counter that counts consecutive numerical values of a same quantity as the number of the element units associated with the connection unit; and
    a multiplexer that sends the values indicating the state of the nodes, which are retained in the element unit associated with a count value of the first counter, to the corresponding other semiconductor chip via the inter-chip wire according to the count value of the first counter; and
    wherein the receiver connector includes;
    a second counter that counts consecutive numerical values of a same quantity as the number of the element units associated with the connection unit; and
    a demultiplexer that distributes the values indicating the state of each of the nodes, which is sent from the other semiconductor chip via the inter-chip wire, to the element unit associated with a count value of the second counter according to the count value of the second counter.

11. The semiconductor device according to claim 10, further comprising a controller that controls operation of each of the semiconductor chips,
    wherein the controller initially resets each of the first and second counters in each of the semiconductor chips.

12. A semiconductor device comprising:

a plurality of semiconductor chips, each of which simulates an interaction between nodes of an interaction model; and an inter-chip wire connecting the semiconductor chips, wherein the plurality of semiconductor chips are used to simulate an interaction between nodes of a single interaction model;

wherein each of the semiconductor chips includes:

a plurality of element units, each of which retains values indicating a state of corresponding nodes and interaction coefficients between other nodes causing an interaction over the nodes and determines values indicating a next state of the corresponding nodes, based on the retained values indicating the state of the nodes and each of the interaction coefficients and values indicating a state of each of other nodes causing interactions over the corresponding nodes; and a connection unit that sends and receives part of the values indicating the state of the nodes, which are retained by a necessary element unit, via the inter-chip wire to and from another semiconductor chip or sends and receives the values indicating state of the nodes, which are retained by the necessary element unit, to and from the other semiconductor chip via the inter-chip wire while sharing the inter-chip wire by means of time sharing, wherein a specified number of element units are N element units; and wherein the connection unit includes N−1 pieces of wiring, an interaction clock generator that generates an interaction clock; and a controller that controls the interaction clock generator;

wherein each of the element units in each of the semiconductor chips determines a value indicating a next state of the nodes retained by the element unit itself in synchronization with the interaction clock; and wherein the controller controls the interaction clock generator to gradually reduce frequency of the interaction clock in a stepwise manner.

13. The semiconductor device according to claim 12, wherein the connection unit is associated with an element unit among the element units, which retain the values indicating the state of the nodes required within a present semiconductor chip, and sends and receives the values indicating the state of the nodes, which are retained by the associated element unit, and the values indicating the state of the nodes, which are retained by a corresponding element unit in a corresponding other semiconductor chip, to and from the other semiconductor chip via the inter-chip wire.

* * * * *